US006775427B2

(12) United States Patent
Evans

(10) Patent No.: US 6,775,427 B2
(45) Date of Patent: Aug. 10, 2004

(54) LATERALLY COUPLED WAVE GUIDES

(75) Inventor: Gary A. Evans, Plano, TX (US)

(73) Assignee: Photodigm, Inc., Richardson, TX (US)

( * ) Notice: Subject to any disclaimer, the term of this patent is extended or adjusted under 35 U.S.C. 154(b) by 321 days.

(21) Appl. No.: 10/092,867

(22) Filed: Mar. 7, 2002

(65) Prior Publication Data

US 2002/0126942 A1 Sep. 12, 2002

Related U.S. Application Data

(60) Provisional application No. 60/274,584, filed on Mar. 9, 2001.

(51) Int. Cl.[7] .............................. G02B 6/12; H01S 3/19
(52) U.S. Cl. ............................ 385/14; 385/37; 385/42; 385/130; 385/131; 385/132; 372/43; 372/50; 372/97; 372/102
(58) Field of Search ............................. 385/14, 37, 39, 385/40, 42, 92, 129, 130, 131, 132; 372/43, 50, 98, 102

(56) References Cited

U.S. PATENT DOCUMENTS

| | | | | |
|---|---|---|---|---|
| 4,006,432 A | | 2/1977 | Streifer et al. | 331/94.5 C |
| 4,888,785 A | * | 12/1989 | Lee | 372/50 |
| 4,919,507 A | | 4/1990 | Evans et al. | 385/37 |
| 4,958,357 A | | 9/1990 | Kinoshita | 372/96 |
| 5,463,705 A | * | 10/1995 | Clauberg et al. | 385/14 |
| 5,499,256 A | * | 3/1996 | Bischel et al. | 372/28 |
| 5,511,084 A | * | 4/1996 | Amann | 372/20 |
| 5,673,284 A | * | 9/1997 | Congdon et al. | 372/50 |
| 5,841,929 A | * | 11/1998 | Komatsu et al. | 385/129 |
| 5,970,081 A | | 10/1999 | Hirayama et al. | 372/96 |
| 6,064,783 A | | 5/2000 | Congdon et al. | 385/15 |
| 6,360,038 B1 | * | 3/2002 | Grubsky | 385/28 |

OTHER PUBLICATIONS

"Surface Emitting Semiconductor Lasers and Arrays", Ed. Evans and Hammer, Academic Press, 1993.

"Optimized Couplers Between Junction Lasers and Single Mode Fibers", Hammer, Neil, RCA Laboratories, Princeton, NJ, Final Report, Aug. 31, 1981–Jan. 31, 1983.

"Observations and Theory of High Power Butt Coupling to $LiNbO^3$–type Waaveguides", Hammer and Neil, IEEE J. Quantum Electronics, QE–18, 1751–1758, Oct. 1982.

"Bow–Tie Surface Emitting Lasers", Bedford, R., Luo, H., Fallahi, M., IEEE Photonics Tech. Let., vol. 12, No. 8, Aug. 2000.

"Surface–Emitting Distributed Feedback Quantum–Cascade Lasers", Schrenk, W. et al., Applied Physics Letters, vol. 77, No. 14, Oct. 2, 2000.

(List continued on next page.)

*Primary Examiner*—Brian M. Healy
(74) *Attorney, Agent, or Firm*—Duke W. Yee; Patrick C. R. Holmes

(57) ABSTRACT

A system capable of creating multiple beams of light using laterally coupled waveguides. Each beam is of a different central wavelength, capable of being generated on chip and coupled into a single fiber, and emitted from a single outcoupling grating (OCG). The present innovations can be used to create a multiple wavelength source generating multiple signals of different wavelengths simultaneously. The present innovations can also function as a tunable laser source system, capable of generating one of many different wavelength signals at a time. Waveguides are laterally coupled through, for example, evanescent coupling. The degree of coupling is controlled by varying the voltage applied to contacts attached to the waveguides at the coupling region.

20 Claims, 29 Drawing Sheets

OTHER PUBLICATIONS

"Analysis of Grating Surface Emitting Lasers", Noil, R.J., Macomber, S.H., IEEE Journal of Quantum Electronics, vol. 26, No. 3, Mar. 1990.

"Facetless Bragg Reflector Surface–Emitting AlGaAs/GaAs Lasers Fabricated by Electron–Beam Lithography and Chemically Assisted Ion–Beam Etching", Tiberio, R.C., et al., J.Vac.Sci.Technol. B9 (6), Nov./Dec. 1991.

"Laser Diode End Fire Coupling Into TI:LiNbO$_3$ Waveguides", Burns, Appl, Optics, 18, 2536–2537, Aug. 1979.

Research Toward Optical Fiber Transmission Systems Part 1, Miller et al., Proc. IEEE, 61, 1703–1751, Dec. 1973.

\* cited by examiner

LATERALLY COUPLED WAVE GUIDES

RELATED APPLICATIONS

The present application is related to, and claims the benefit of priority of, co-pending provisional U.S. Patent Application Serial No. 60/274,584 entitled "Laterally Coupled Waveguides," filed on Mar. 9, 2001, which is hereby incorporated by reference in its entirety.

BACKGROUND OF THE INVENTION

1. Technical Field

The present application relates to laser diodes, and more particularly to the coupling of multiple waveguides in a laser diode system.

2. Description of Related Art

Transmission of light through waveguides has been pursued for many types of communications applications. Light signals offer many potential advantages over electronic signals. Light sources are commonly created from semiconductor devices, and include semiconductor devices such as LEDs (Light Emitting Diodes) and LDs (Laser Diodes).

Optical fiber is the most commonly used transmission medium for light signals. A single fiber is capable of carrying several different modulated signals within it at one time. For instance, wavelength division multiplexing divides the used bandwidth of the fiber into different channels (each channel containing a small range of wavelengths) and thus transmits several different wavelengths (or signals) of light at once. Using such a system requires sources for the different wavelengths. More wavelengths on the fiber require more sources to be coupled to the fiber.

Efficient coupling of light into a fiber is simplified if the laser beam has a cross sectional profile that matches the profile of the fiber mode(s). Efficient use of light for communications requires that the light have high temporal coherence. Efficient coupling of light to monomode guides requires spatial coherence. Spatial coherence requires the laser to operate in a single lateral and transverse mode. Temporal coherence requires the laser to operate in a single longitudinal mode and implies a very narrow bandwidth, or range of wavelengths.

The most coherent semiconductor lasers use resonators based on grating feedback rather than Fabry-Perot resonators with reflective end facets. Distributed feedback (DFB) lasers use a Bragg reflective grating covering the entire pumped length of the laser. An alternative to DFB lasers is the use of distributed Bragg reflectors (DBRs) located outside the pumped region.

In conventional DFB and DBR lasers, light is removed through an end facet and the output beams have dimensions entirely controlled by the vertical (i.e., normal to the surface) (x) and lateral (y) size and the composition of the guiding structure. Such output beams are typically have too great a divergence for effective coupling to optical fibers, or for other applications requiring beams with low divergence angles.

Beam dimensions (in at least one direction) larger than that available from laser facets may be obtained by using a Bragg grating to couple light out of the waveguide normal (or at certain fixed angles) to the waveguide surface. So called second order Bragg gratings have a period equal to the wavelength of light of the guided mode. The second grating order of such a grating reflects some of the light back in the waveguide plane while the first order couples some of the light normal to the plane. So called first order (Bragg) gratings have a period equal to one half the wavelength of light in the guided mode, reflect light in the waveguide plane, and do not couple light out of the waveguide. First, second, and third order (etc.) gratings are sometimes referred to as being in resonance. A non-resonant grating couples light out of the waveguide at an angle to the normal and does not reflect any light in the waveguide plane.

U.S. Pat. No. 5,970,081 to Hirayama et al. appears to show a laser with a distributed feedback (DFB) grating of second order or higher that claims to obtain a Gaussian shaped output beam by narrowing the waveguide or using a chirped grating at the outcoupling portion. They do not seem to recognize that by so doing the resonant wavelength of the grating is altered along the length of the narrowing or chirping. This would be expected to result in an output which will fan in angle along the longitudinal direction rather than produce a simple Gaussian intensity variation emitted normal to the plane as claimed. They do not define the beam shape in the lateral direction. In all versions they choose second order outcoupling gratings which, absent a narrowing waveguide or chirp, would emit light perpendicular to the surface of the laser waveguide.

U.S. Pat. No. 4,006,432 to Streifer et al. appears to show a grating out-coupled surface emitting DFB laser. The grating period may be chosen to be either resonant or not.

A paper by Bedford, Luo, and Fallahi titled Bow-Tie Surface-Emitting Lasers (IEEE Photonics Technology Letters, Vol. 12, No. 8, August 2000) appears to show a DBR laser with curved second order grating at the ends to couple light out of the waveguide. The same gratings are used for outcoupling and for reflecting the light within the waveguide. They mention the use of non-resonant gratings in conjunction with reflector gratings if emission at other than the direction normal the waveguide plane is desired. The paper appears to show a flared resonator region which allows symmetric outcoupling from both ends of the laser. This facilitates two outputs that are coherent with one another, with emission in the same direction. Such a device is meant to alleviate the complications of controlling the relative phase between the two emitters.

The Tiberio article (Facetless Bragg reflector surface-emitting AlGaAs/GaAs lasers . . . , J. Vac. Sci. Technol., B9(6), 1991) appears to show a surface emitting laser diode that uses first order reflective gratings and either second order (or non-resonant) gratings for outcoupling. Thus, depending on the chosen grating period, the outcoupled beam can be normal or at an angle to the surface.

U.S. Pat. No. 6,064,783 to Congden appears to show a DBR laser with a grating assisted waveguide coupler that couples light from the laser waveguide to a parallel fiber-like glass waveguide for later coupling to a fiber. Several different lasers are coupled to similar fiber-like glass waveguides in the figures. The fiber axis is parallel to the laser waveguides. This reference mentions that this model is easily attached to a fiber through "butt coupling." The grating acts as a Quasi Phase Matching element to couple the light from the laser waveguide to the fiber-like glass waveguide.

The optical and electronic properties of a semiconductor depend on the crystal structure of the device, which has led to investigative work into fabricating artificial structures or superlattices. By tailoring the crystal structure of a device during its fabrication, the optical and electronic properties can be controlled. The crystal structures of such devices may be controlled, for instance, by molecular beam epitaxy (MBE) and metal-organic chemical vapor deposition (MOCVD). Such techniques are capable of monolayer control (~5 angstrom) over the chemical composition of a crystal.

Other commonly used heterostructures are quantum wells, in which a single layer of one semiconductor is sandwiched between two layers of a larger bandgap material. Strain is produced by using an epitaxial layer with a different lattice constant than the substrate. This strain has a dramatic effect on the properties of the optical system. Among other things, it can allow bandgap tunability, reduced threshold current, and improved laser reliability.

Strain can also allow laser emission to have tailored polarization. By using appropriate strain, one can produce light predominantly polarized as TE, or TM.

SUMMARY OF THE INVENTION

This application discloses a laser source and system for coupling multiple waveguides in a laser diode system. In an example of a preferred embodiment, the source is a laser diode and has an active region with distributed Bragg reflectors at either end to reflect light within the cavity, and an outcoupling grating in the center or elsewhere within the cavity (defined by the end DBRs) of the device which couples light out of the cavity. On either side of the outcoupling grating is a gain region with electrical contacts for supplying current. In some embodiments, the outcoupling grating may be at the end of a gain region with only a DBR and not a gain region on the other side. Optically attached to the central waveguide are added waveguides which couple light into the central waveguide, preferably via evanescent coupling or grating assisted coupling. In an example of a two-cavity system, two added waveguides are optically attached to the central waveguide. Each of the added waveguides has a reflector at one end, and the other end couples to the central waveguide near the outcoupling region of the central waveguide. Light generated in one of the added waveguides passes into the central waveguide at the coupling region. Part of the light is outcoupled, part passes back into the other added waveguide, which is optically attached to the central waveguide on the other side of the outcoupling region with respect to the first of the added waveguides. Hence, the two added waveguide, plus the outcoupling section of the central waveguide, comprise a second cavity. This second cavity can generate light of a different central wavelength than the central waveguide, for example, by using reflective gratings that are of different period than those of the central waveguide.

The present innovations disclose a system capable of creating multiple beams of light. Each beam is of a different central wavelength, capable of being generated on chip and coupled into a single fiber, and emitted from a single outcoupling grating.

This basic laser diode design makes it easier to limit the length of the outcoupling grating to short lengths, on the order of about 10 microns. In previous designs where the outcoupler is outside the DBR laser region, it becomes very difficult to outcouple 100% of the light in such a short distance. The light that is not coupled out is wasted and decreases device efficiency.

The disclosed innovations, in various embodiments, provide one or more of at least the following advantages:

low cost;
device testing at the wafer level;
emission at all wavelengths from 0.6–2.0 microns with existing and common material systems, with greater ranges possible;
emission is easily extended to any wavelength as new material systems and laser designs mature and/or are developed;
low drive currents;
higher power capability than existing VCSELs;
high efficiency;
direct replacement for VCSELs;
easily coupled to multi-mode and single-mode fibers.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 7b shows a close up of the crossed gratings for the laser system of FIG. 7a.

DETAILED DESCRIPTION OF THE PREFERRED EMBODIMENT

Figure 1A:
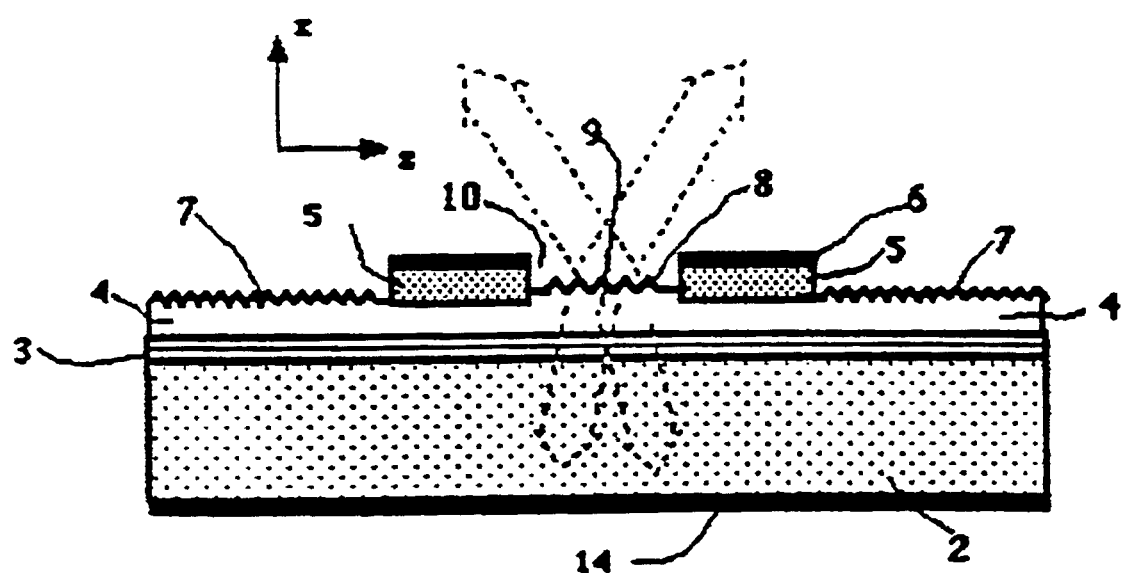
FIG. 1a shows side view of an innovative DBR laser.

The numerous innovative teachings of the present application will be described with particular reference to the presently preferred embodiment (by way of example, and not of limitation).

First order outcoupling gratings and second order or higher outcoupling gratings are both used in at least some embodiments of the present innovations. In the present application, first order DBR refers to a distributed Bragg reflector grating that reflects light within the waveguide in first order for feedback. A second order DBR grating will outcouple light in first order, and feedback light in second order.

In several variations in this application, second order feedback gratings (which couple light out in first order) are used. In such arrangements, the feedback grating depth or strength is varied in the y and z directions so that both the loss and the feedback from the grating help to stabilize the laser mode. For example, the first order lateral mode will be stabilized if the grating strength is varied so that the feedback varies like a Gaussian. This is accomplished by forming the grating so that its strength varies as $$1-\exp[-(y/\omega)^2]$$

where y is the direction parallel with the feedback grating surface and perpendicular to the cavity length, with the origin taken to be at the center of the outcoupling grating, and omega is half the y grating dimension.

First order outcoupling gratings are gratings which couple light out of the waveguide plane in first order but may or may not satisfy the in-plane Bragg condition for second or higher order Bragg reflection. Such gratings may be designed to create no second or higher order reflections which feedback into the laser mode. In these variations which use such out-coupling gratings with no in-plane feedback, the gratings cause no destabilizing feedback into the laser mode and are mechanically and electrically isolated from the structure used to form and pump the resonant laser cavity. Thus, the length and position of the output grating can be chosen to suit the needs of the application for which the laser is designed. The grating periods required for outcoupling, with and without in-plane reflections, are summarized in "Surface Emitting Semiconductor Lasers and Arrays," G. A. Evans and J. M. Hammer, Eds., Academic Press, 1993, which is hereby incorporated by reference.

In general, second and higher order feedback gratings can result in some outcoupling. However, these are less preferred in the context of the present application since such higher order interactions are less efficient.

The outcoupling angle of the gratings in the innovative systems herein disclosed is measured as an angle from the normal to the surface of the outcoupling grating. Resonant outcoupling occurs when the outcoupling grating has a period that is equal to an integer number of wavelengths of the light in the cavity. A grating with period equal to the wavelength of light in the laser cavity will outcouple some light normal to the laser plane and reflect some light in-plane in second order. This means the light exits the grating parallel or nearly parallel to the normal. Outcoupling of light off the normal occurs when the grating is not an integer number of guide wavelengths, and in such a case the light exits the grating at an angle from the normal. This angle depends on the difference between the guide wavelength and the grating period. Varying the wavelength of light or the outcoupling grating period can therefore have great effect on the angle of outcoupled light. The out-coupling grating length, longitudinal position, and the output angles may therefore be chosen over a large range of values. The grating may also be shaped to achieve an output beam of a desired cross section. This is valuable for coupling the output light into fibers of different cross sectional size or at different angles than exactly or nearly normal. All of these "off normal" parameters may be varied without fear of significant mode destabilization or disruption of laser coherence. In the case of exactly or near normal outcoupling, there can be significant in-plane reflection that may (or may not) adversely affect the performance of the laser.

FIG. 1a shows a cross sectional view of a preferred embodiment, taken to show the x-z plane. It should be understood that the features in the several figures may not be to exact scale because of the large differences in dimension between the various structures illustrated.

Layers 3, 4, 5, and 6 are grown on a substrate 2 by known means. Each of these layers may comprise a number of sub-layers. Beneath the substrate is the n contact layer 14. The substrate may comprise a thick layer of n-type semiconductor with a top layer of similar n-type material interposed beneath layer 3. This is frequently called the n-cladding or n-clad. The n-clad will have a refractive index below that of layer 3. Layer 3 is the active and guiding layer usually containing the junction between p- and n-type semiconductor materials. It may comprise, for example, a sequence of one or more barrier layers alternating with quantum well layers. Layer 4 is a p-type clad layer and has lower refractive index than layer 3. Layer 5 may be a multi-layer including a p-clad material chosen to enable good contact to 6 which is the p-metallic contact. Layer 14 provides the other electrical contact for the laser. There are many sequences of possible layers for semiconductor lasers and amplifiers, and the present innovations are not limited to the structures recited here. For example, a structure with a p-type rather than an n-type substrate (and all the necessary alterations to accommodate a change from p- to n-type materials and vice versa) is within the contemplation of the present application.

Gratings 7 are surface relief DBR gratings chosen to reflect light in the +/−z direction to form the laser cavity. (Note that these gratings can be buried structures within the device, and the term "surface relief" does not require the grating be on the surface of the device after processing.) The laser mode will be a standing wave which may be considered to be formed by two waves one flowing in the +z direction, the other in the −z direction. First order DBR gratings are preferred, but second or higher order gratings are also possible. The DBR grating depth and length and the thickness of layer 4 are chosen to provide the desired feedback as known in the art.

The reflector gratings can be given added functionality by varying their grating strength or amplitude in both the y (lateral) direction and the z (cavity) direction. Variation of the grating strength in the lateral direction will impart to the cavity mode light a Gaussian shape, allowing for more of the optical energy of the emitted light to be coupled into a circular mode, such as a fiber. Variation of the grating strength in the z direction can improve the suppression of unwanted longitudinal modes on either side of the desired longitudinal mode. the degree to which the unwanted modes are suppressed is called the side-mode suppression ratio.

The outcoupling grating 8 (sometimes referred to herein as OC grating, or OCG) is a surface relief grating with period chosen to couple light at desired angles from the grating plane. It is located at an aperture on the surface of the device. In a preferred embodiment, the outcoupling gratings are about 10 microns wide. The outcoupling grating may be shaped to control the shape of the emitted beam. The grating depth and thickness of the p-clad layer 9 in the vicinity of the grating 8 are chosen to provide the desired degree of outcoupling and to control beam shape. A window or aperture 10 in layers 5 and 6 is provided to allow unobstructed emission of light, and the size and shape of the outcoupling grating is matched to the mode of the fiber to which it couples light (in one embodiment). Because of the two standing waves in the cavity and reflection from the grating, the outcoupling grating simultaneously emits four different light beams, two above and two below the grating plane. These are depicted by dashed arrows. In the case of normal outcoupling of the laser light, the two top lobes are combined into a single beam, as are the two bottom lobes of emitted light.

In one embodiment, the outcoupled light is emitted normal to the surface, since one primary goal is to couple this light into a fiber. When light is emitted normal to the surface, the two top emitted beams are combined into a single beam, and likewise with the downward emitted beams.

Off normal emissions and slightly off normal emissions are also very useful. For example, changing the angle of entry to a fiber by several degrees has minimal impact on the coupling efficiency yet allows the use of an off resonance grating which minimizes undesired feedback into the laser. A larger angle might be desirable to send light to another detector to monitor the laser.

Figure 1B:
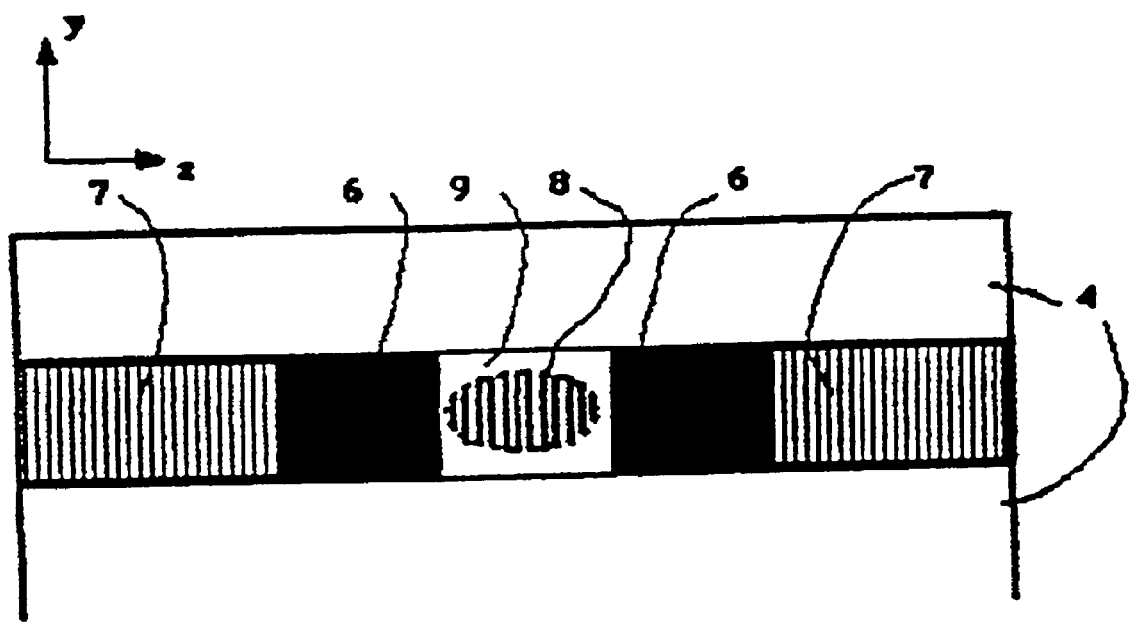
FIG. 1b shows a top view of an innovative DBR laser.

FIG. 1b shows a top view of a single grating outcoupled DBR laser. The outcoupling grating 8 is located at an outcoupling aperture within the envelop of the gain region. On either end of the laser are located distributed Bragg reflectors 7 for providing feedback into the cavity. Of course, cleaved facets may also be used instead of reflector gratings, with highly reflective coatings applied to reflect the light, as shown in later embodiments. With either DBR reflectors or coated facets, the reflectivity of one or both ends can be varied to allow light to escape the cavity for other purposes.

Another embodiment will be discussed with reference to FIGS. 2a and 2b. In this variation, crossed out-coupling gratings are located within the cavities of two (or more) semiconductor lasers arranged at angles to one another and located on a common substrate. In one embodiment, two lasers are used and are positioned at 90 degrees from one another, but more lasers are of course possible—see FIG. 7a for example. The shape and strength of the two gratings are chosen to produce desirable properties in the out-coupled light. Their periods are individually chosen to suit the desired application, such as to control outcoupling angle, or to couple out different wavelengths.

Figure 2A:
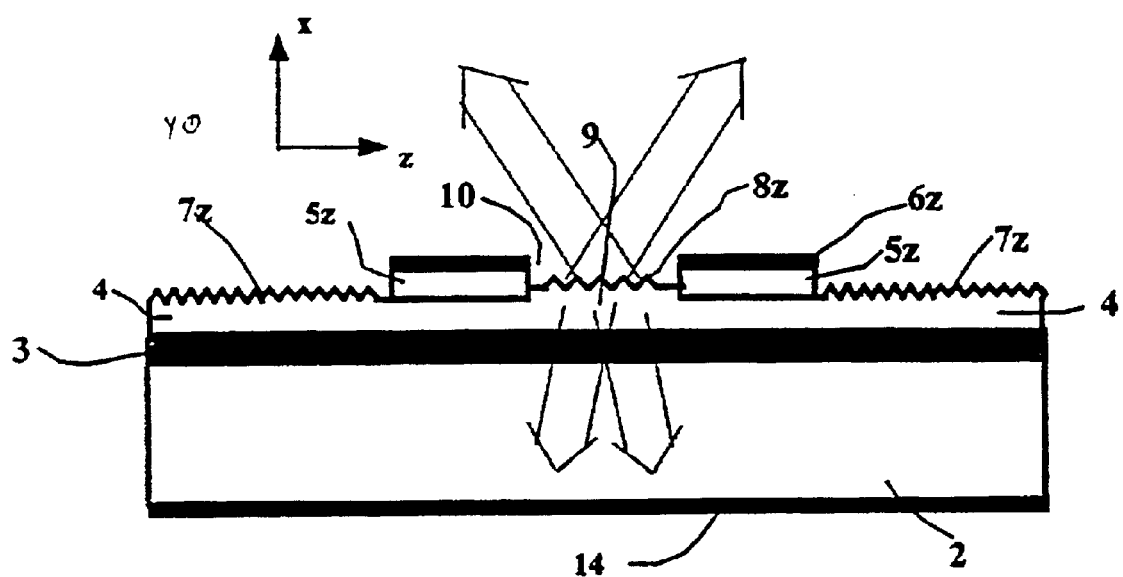
FIG. 2a shows a side view of crossed DBR lasers.

FIG. 2a shows a side view of the crossed grating outcoupled DBR lasers. The structure when seen from the side is similar to that of FIG. 1. Elements that are unique to the laser running in the z-direction are labeled with a z suffix, and elements unique to the laser running in the y-direction are labeled with a y suffix.

Figure 2B:
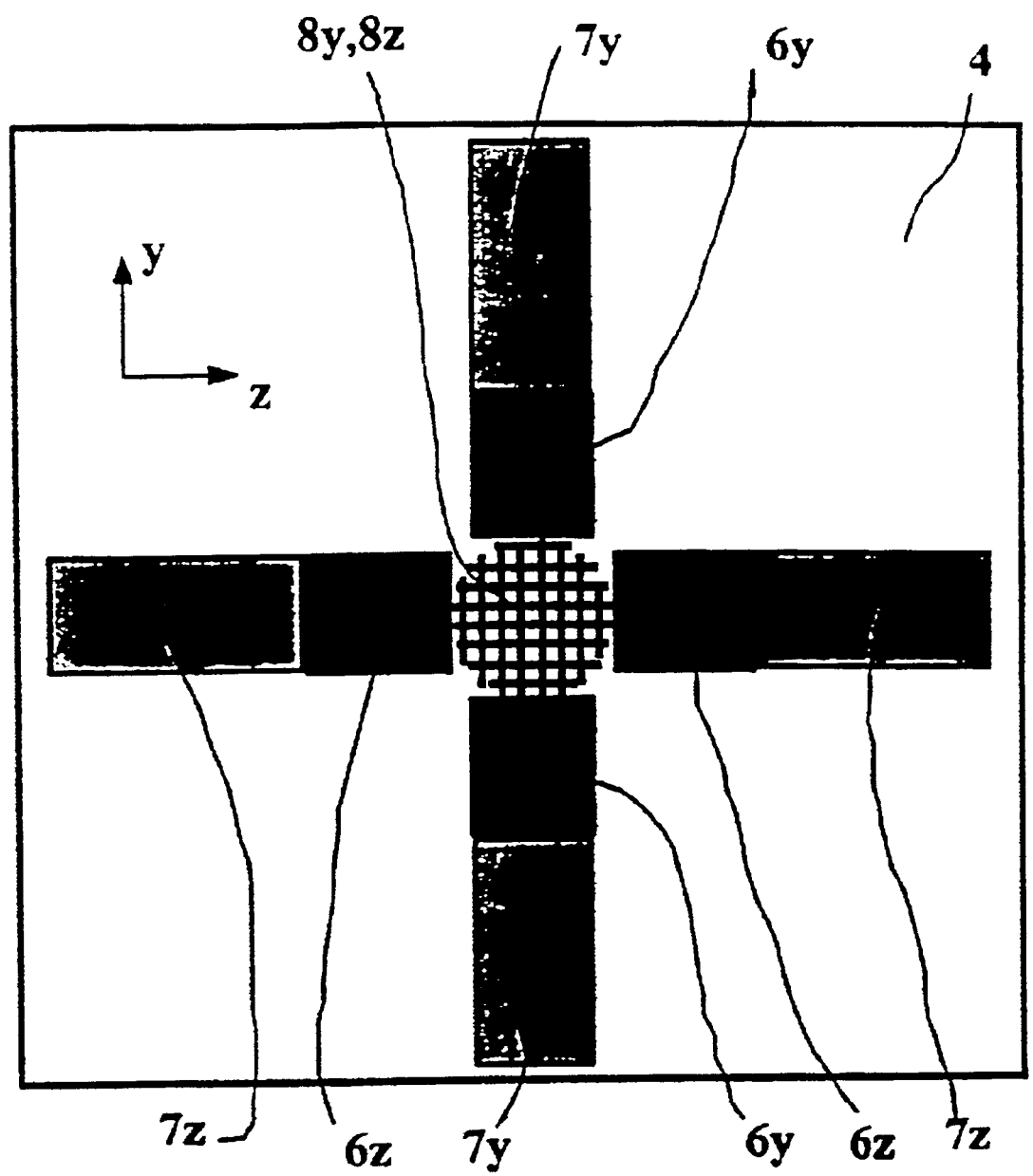
FIG. 2b shows a top view of crossed DBR lasers.

Referring to FIG. 2b, a top view, two crossed DBR lasers are at 90 degrees to one another. Each laser has its own set of reflector gratings 7y, 7z at either end, and both lasers have their own out-coupling grating 8y, 8z positioned at a common location between the reflector gratings. (In the preferred embodiment, the outcoupling aperture is located at the center of the laser, but this is not necessary.) On either side of the out-coupling gratings are the pumped regions of the lasers. (Note that in this variation, the two gain regions of a single laser are discontinuous, having different parts on either side of the outcoupling grating. Other possible embodiments include a single gain region with an outcoupling grating outside the gain region but between the reflector gratings, or even a single continuous gain region that spans the outcoupling grating, having portions on both sides.) The two out-coupling gratings are located at the same place, and the superposition of the two gratings forms a virtual grating with an effective period at an angle of about 45 degrees if the grating periods are about the same fore each laser.

The reflector grating periods are chosen to internally reflect the proper wavelength of light. The reflectivity of the DBR is very high at the Bragg condition, and drops off rapidly when the wavelength is different than the Bragg condition wavelength. This allows the wavelength of the output light to be controlled by controlling the period of the DBR gratings.

Referring again to FIG. 2a, in the case of crossed lasers, a cross section taken parallel to the x-y plane would be similar with layers noted with y subscripts in place of z subscripts.

Gratings 8y and 8z are surface relief outcoupling gratings with periods chosen to couple light at desired angles relative to the grating (y-z) plane. As shown in the figure, the gratings can be shaped to control the profile of the outcoupled beam. A circular profile for the grating is indicated (a more complicated profile would be optimal for fiber coupling), but any other useful shape can be produced, depending on the application. The grating depth along with the thicknesses and compositions of the epitaxial structure of the laser are chosen to provide the desired degree of outcoupling.

For each laser, four beams are emitted because of the left and right running waves that form the standing wave mode of the laser (unless the light is outcoupled perpendicular to the device). Two beams symmetrically angled around the normal will emerge above the grating plane and pass through the window 10. Similarly, two beams will be directed towards the substrate below. (Note the epi layers are transparent and this transparency can be made use of to couple light out through the bottom of the device. In such a case, a reflector is placed on the top of the device to direct the top emitted light back into the laser or out the bottom.) In some designs, the grating may be blazed to allow light to be outcoupled to the right or left of normal as well.

When two or more lasers are combined in this way, the crossed outcoupling gratings each polarize the light which they outcouple. In the case of two crossed gratings at 90 degrees, the two beams of light will be polarized at 90 degrees with respect to one another. Coupling light into a fiber with two orthogonal polarizations is required for pumping Raman amplifiers.

Figure 2C:
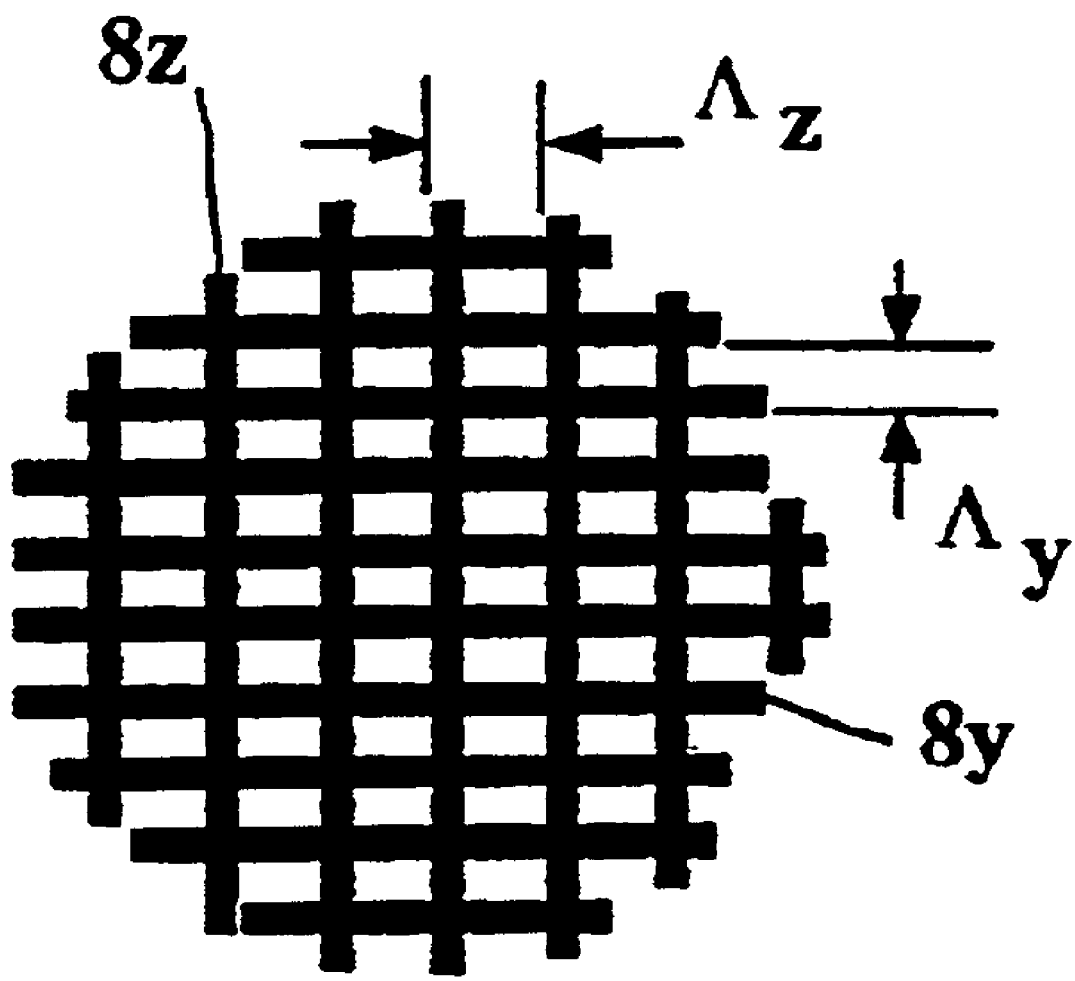
FIG. 2c shows a close up of crossed outcoupling gratings.

FIG. 2c shows a close up of the outcoupling gratings of FIGS. 2a and 2b. The periods, Ly and Lz, of the superimposed two gratings need not be identical. The OCG periods will depend both on the wavelength of light in the cavity (which in turn depends on the periods of the DBR gratings at either end of the cavity) and on the desired outcoupling angle for the emitted beam. By choosing the two gratings to have different OC angles, spatial separation is possible, as may be desired by particular applications. In still another embodiment, the laser light from the devices is emitted normal to the surface, so that both wavelengths of light can be coupled into a fiber through the same aperture or location on the device.

By choosing a non-resonant spacing for the outcoupling grating period (i.e., a distance between grating lines that is not an integer multiple of the wavelength of light within the cavity) the output beams are emitted non-normal to the surface. This is useful in applications where, for example, the fiber into which the light is to be coupled is at an angle relative to the outcoupling grating.

The choice of normal or off normal outcoupling angles can have other advantages. For example, when two or more different wavelengths of light are coupled out of the OC gratings, all wavelengths can be coupled into the same fiber or separated as desired by varying the output angles of the individual gratings. For example, the individual outcoupling gratings for two crossed devices could each couple different wavelengths of light out normal to the surface to couple two different wavelengths into a single fiber mode. This is particularly applicable in the crossed grating out-coupled lasers, discussed further below. If, for some reason, only one wavelength is needed in the fiber, the light from the other device can be emitted off normal so as to not couple into the fiber. The non fiber coupled light could be deflected to a detector, for example. Regardless of the particular use, the choice of outcoupling angles is an advantage to a laser device, and the present application shows how different wavelengths from different sources can be selectively combined into a single region for coupling, or separated into different regions.

The shape and strength (i.e., the depth) of the OC gratings are chosen to produce desirable properties in the out-coupled light. The periods of all OC gratings can be individually chosen according to the needs of that particular laser and the application. For example, the two crossed OC gratings of FIG. 2b can be chosen to outcouple different wavelengths of light, allowing the two lasers of the crossed laser configuration to have different wavelengths, one in the z-direction, another in the y-direction. This of course extrapolates to higher numbers of lasers. Additionally, the two outcoupling gratings (and the different laser diodes themselves) can be chosen to emit the same wavelengths (for example, by making their feedback grating periods the same) allowing additional power and polarization variety in the outcoupled beam(s).

The basic idea can be extended to include a multiplicity of lasers radially arranged around a set of gratings oriented to outcouple light independently for each laser. This allows many wavelengths of light to be generated by merely choosing a different period for the pair of DBRs for each individual laser. The OC gratings can couple this light into a single spatial region (for example, to couple several wavelengths of light into a fiber for DWDM applications), or it can couple the different wavelengths out of the devices at different angles.

Referring still to FIG. 2b, which shows crossed lasers according to a preferred embodiment, if the Bragg reflector gratings are chosen to have the same period in both the y-direction laser and the z-direction laser so that both lasers operate at the same wavelength, and if the crossed OC grating period Lz is the same as Ly, the superposition of the two gratings at right angles results in a virtual grating with an effective period angle of about 45 degrees (if both grating periods are the same). In this case the possible coupling between the y and z lasers can be avoided if the gain regions use quantum wells with compressive strain and thus favor TE mode operation. The virtual grating at 45 degrees will not efficiently reflect TE modes and therefore will not couple the y and z lasers. On the other hand, the use of tensile strain in the quantum well favors TM modes, and may result in enough coupling to either lock the y and z lasers together into a single coherent source, or provide significant crosstalk and other interactions between the two lasers. Thus, the disclosed approach can choose the nature of the output beams to be either a combined single frequency coherent source, or two output beams with two independent wavelengths, or two beams with independent wavelengths but with a controlled amount of crosstalk between them.

The reflector grating periods for the pair of lasers can be the same, which provides additional power and polarization variety. Alternatively, the grating periods can be different, resulting in two different wavelengths of light being outcoupled. This latter configuration can couple light of different wavelengths out at the same angle for coupling light of different wavelengths into the same fiber, saving the cost of implementing a combiner for this function. For example, if the two lasers have different feedback grating periods, they will each generate a different wavelength of light. But both lasers can emit their light normal to the surface of their respective outcoupling grating by choosing each individual outcoupling grating to couple the necessary wavelength of light out normal to the surface.

The size of the grating output aperture can be adjusted for optimum coupling to single or to multi-mode fiber. Likewise, the efficiency of the output element (be it a grating or other element, such as a beam splitter or holographic optical element) can be adjusted by adding a layer of dielectric material to the outcoupling region. If outcoupling efficiency is too high, a high threshold current is required to lase because of the quantity of photons escaping the cavity. With a reflective layer atop the outcoupling grating, some of the light is reflected and continues to oscillate within the cavity. This has the effect of marginally decreasing the required current for lasing. Adding a dielectric layer (for example, nitride, or a dielectric stack, or even a reflective metallic layer) to the outcoupling location therefore controls outcoupling loss and decreases the required threshold current.

In any configuration of the present application where one or more gratings are located and superimposed on one another, the separate gratings can be individually formed by conventional means (including multiple exposures and etches to form the pattern) or can be merged into a single element using a holographic optical element (HOE). The optical requirements of the gratings can be calculated, and a HOE can be designed that accomplishes these required optical functions. Once designed, such a HOE can be patterned for lithography, and can therefore be fabricated in fewer process steps than it would take to create the multiple gratings separately. For example, multiple divergent beams can be captured and coupled into a single fiber with HOEs.

Figure 3:
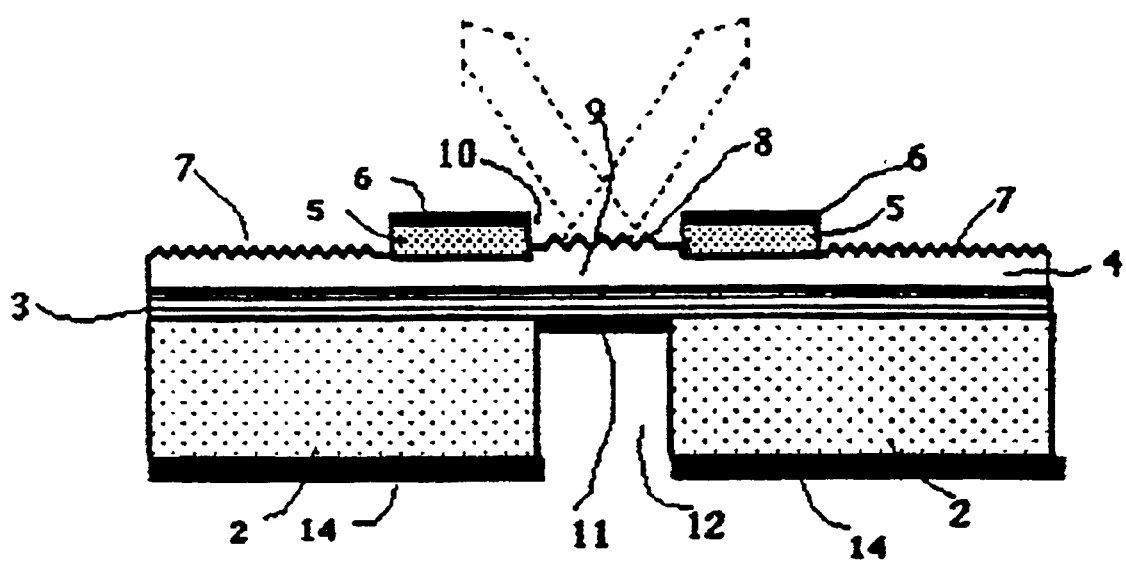
FIG. 3 shows a side view of a DBR laser with a reflective undercoating to reflect laser light.

In another embodiment, shown in FIG. 3, a reflecting surface is placed beneath the outcoupling gratings. This surface 11 reflects the two lower lobes of emitted light. This reflective layer can be made from a metallic substance or other material reflective to the necessary wavelengths of light, or it might be a reflective grating formed in the device, for example. By coupling the lower lobes back up and out of the OC grating, greater power is coupled out of the laser and may be captured by a fiber or other device, such as a detector to monitor the light produced by the device. A space 12 is shown in the substrate of the figure, but the same reflective surface can be placed with the substrate intact.

Figure 4A:
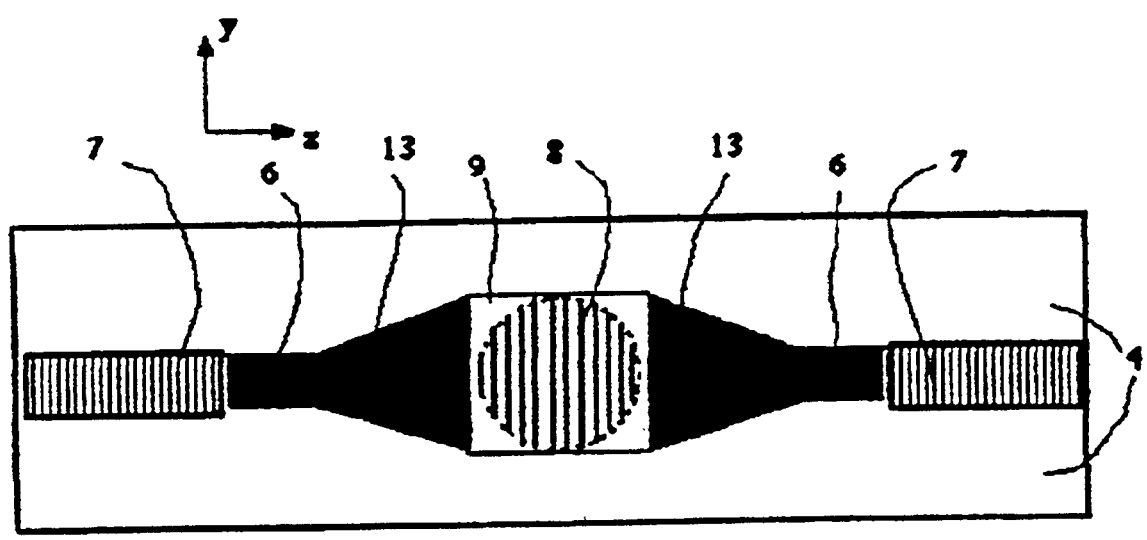
FIG. 4a shows a top view of a DBR with flared or tapering gain regions.

Another embodiment is shown in FIG. 4a, which shows a method to increase the lateral width of the gain regions at the outcoupling grating while maintaining a single-transverse mode. This is accomplished by using a single mode waveguide in the gain region that connects to a tapered gain region. The taper angle is related to the divergence of the fundamental mode of the single mode waveguide. In the preferred embodiment, the tapered regions have a laterally varying current contact, such as a gaussian contact to stabilize the modes in the tapered device.

The embodiment shown in FIG. 4a has a tapered gain region 13. The gain region in this sample has a straight portion as well. Different contacts are used in the preferred embodiment, pumping the different regions with increasing current as necessary. The tapered gain region ensures a wide-spatially-coherent mode, and avoids the restriction on the lateral (y) dimension imposed by the requirement of single lateral mode operation. A wide lateral mode allows the width of the output beam to be set by the width of the grating. The grating area can take a desired shape to match the needs of various applications. For example, circular, elliptical, or Gaussian beams can be produced.

Figure 4B:
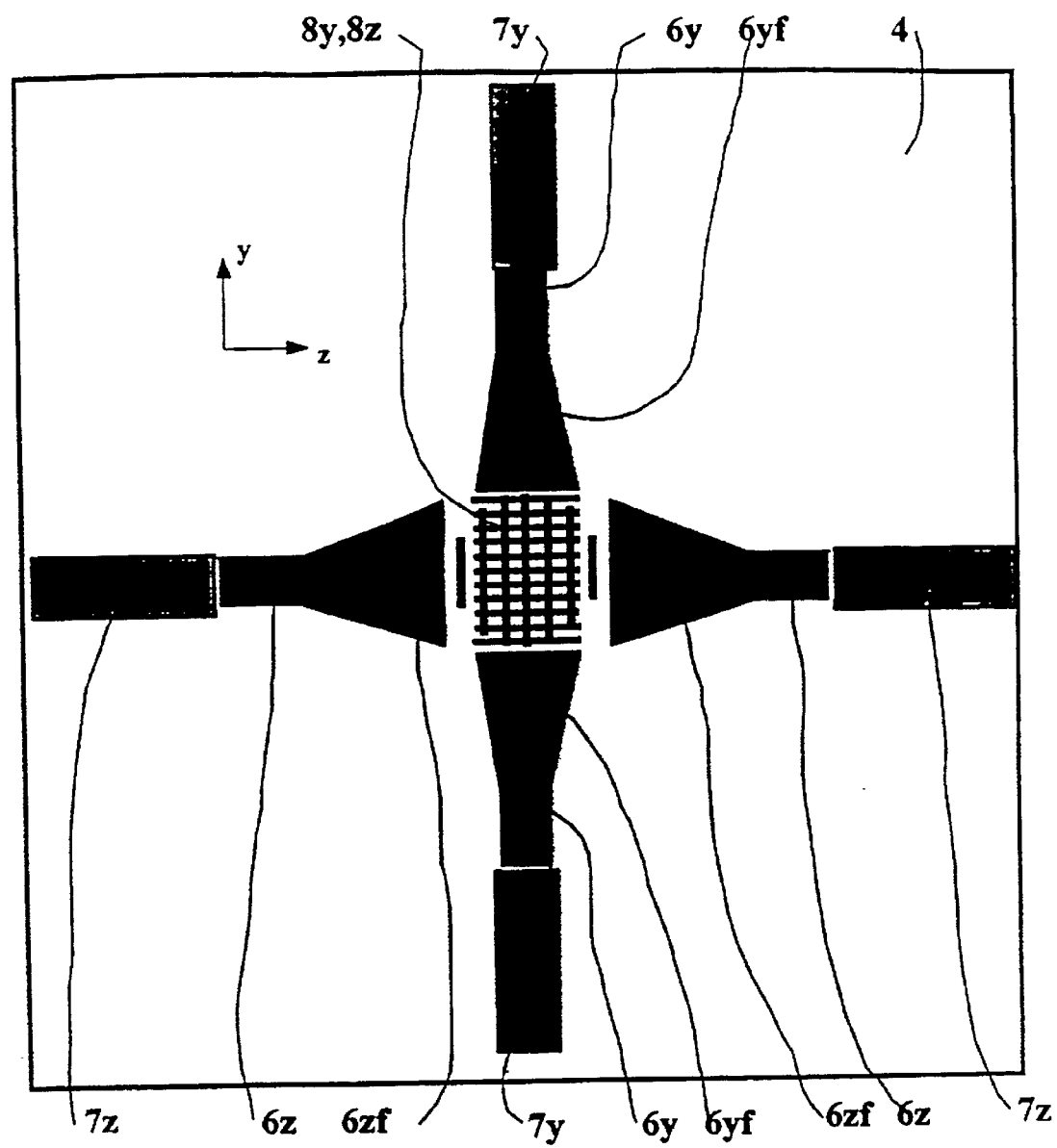
FIG. 4b shows a top view of crossed DBRs each with flared or tapered gain regions.

FIG. 4b shows the tapered gain regions used with multiple crossed grating outcoupled lasers. This embodiment shows two crossed GO (grating outcoupled) lasers at 90 degrees to one another. DBR gratings 7y, 7z, create the cavity as in other embodiments discussed above. The pumped regions of the lasers in this variation have a flared section (labeled with the f suffix), being wider closer to the OC gratings. In this example, one laser has an outcoupling grating that is circular in shape, while the other laser has an outcoupling grating that is rectangular. Using a tapered gain region, outcoupled beams of a greater range of sizes can be produced, as the gain region can be made to whatever width is necessary to accommodate (or fully take advantage of) the size of the OC grating. Tapered gain regions also increase the total amount of emitted power from the device.

Figure 5A:
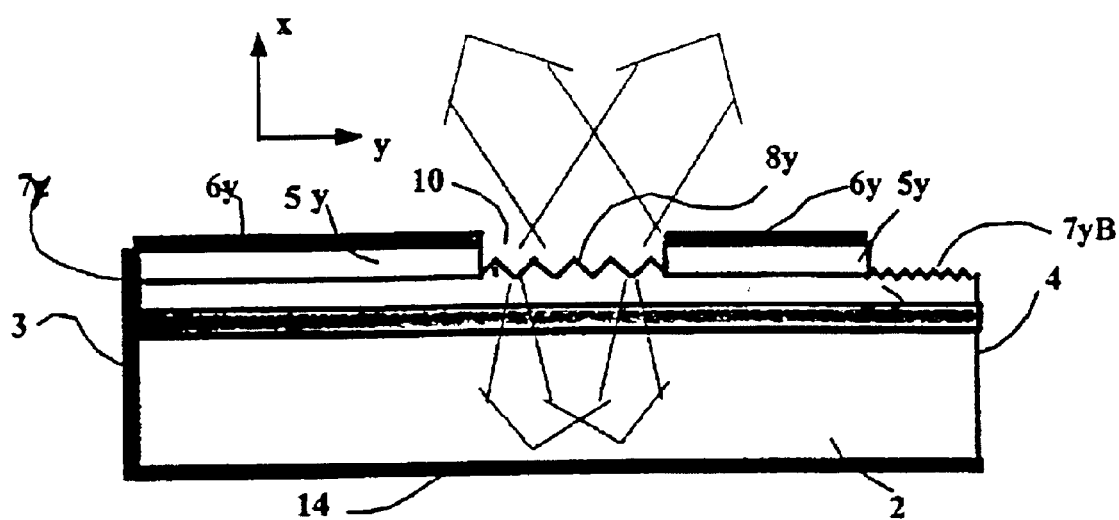
FIG. 5a shows a side view of a laser diode having a DBR at one end and a cleaved facet at the other end.

Another embodiment is shown in FIG. 5a. At one end of the laser, the DBR has been replaced by a reflective end facet 7y. There are still two gain region portions, separated by the OC grating in this embodiment. The other end of the laser has a DBR 7yB, the period of which determines the wavelength that will be stable in the cavity.

Figure 5B:
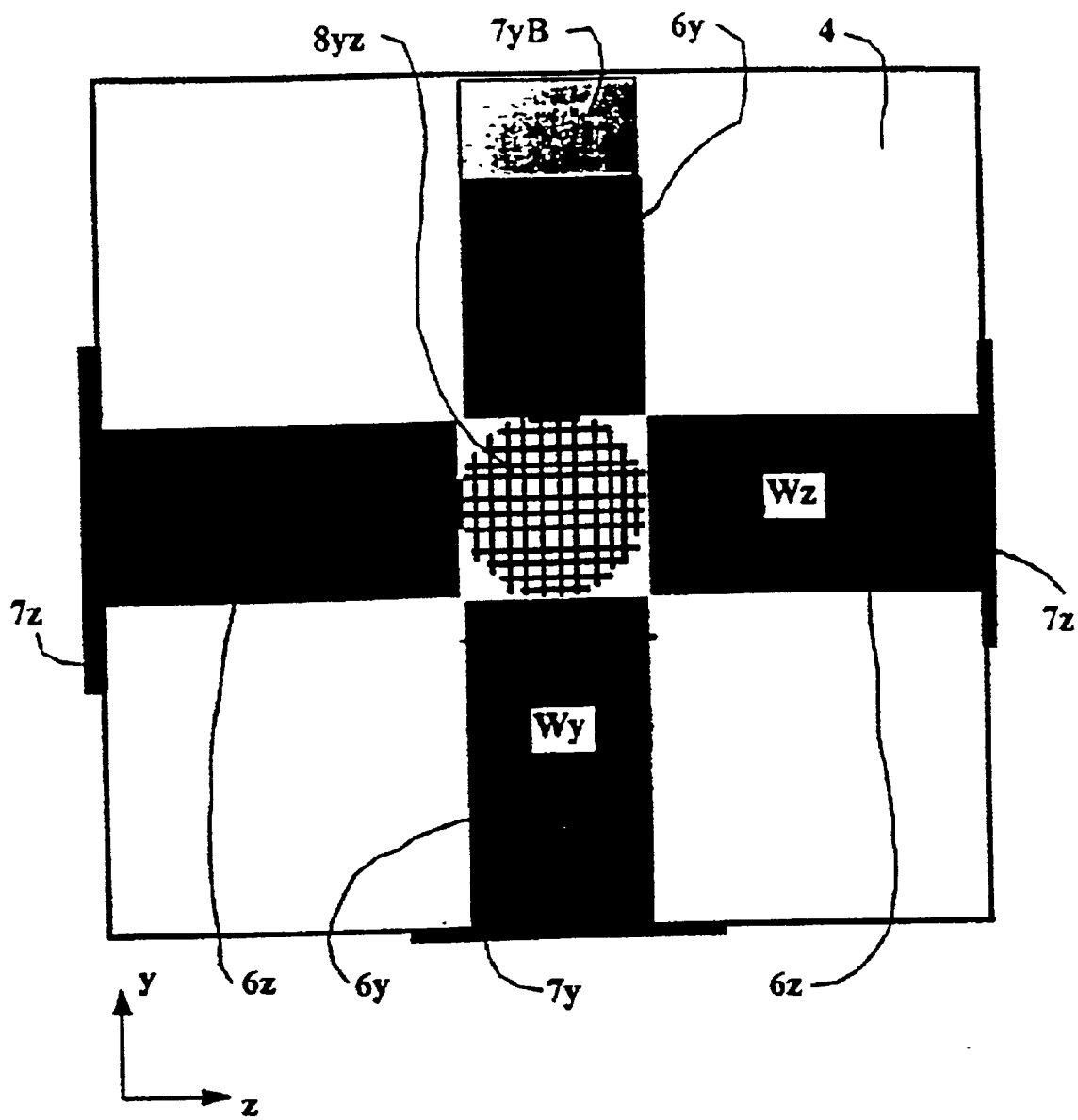
FIG. 5b shows a top view of crossed lasers, using both DBRs and reflecting facets.

A top view of a crossed GO laser system is shown in FIG. 5b. In this variation, the laser running in the z-direction (horizontal in the figure) has reflective end facets on both ends, and no DBRs for reflecting the light in the cavity. The y-direction laser (vertical in the figure) has a DBR at one end, and a reflective facet at the other end. Cleaved facet ends reduce the length of the device since the length of the DBR sections is omitted.

Figure 5C:
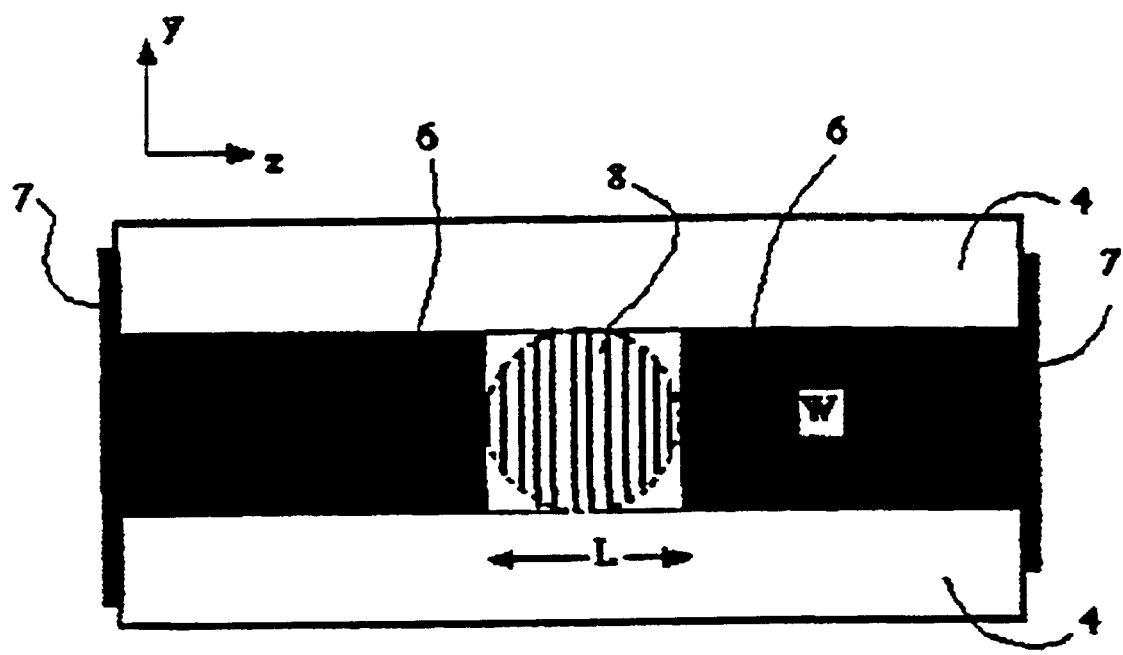
FIG. 5c shows a top view of a laser diode using cleaved facets.

FIG. 5c shows a top view of a laser diode with cleaved facets at both ends. The length of the gain region is fixed by the reflectivity of the end facets or the DBRs.

Figure 6:
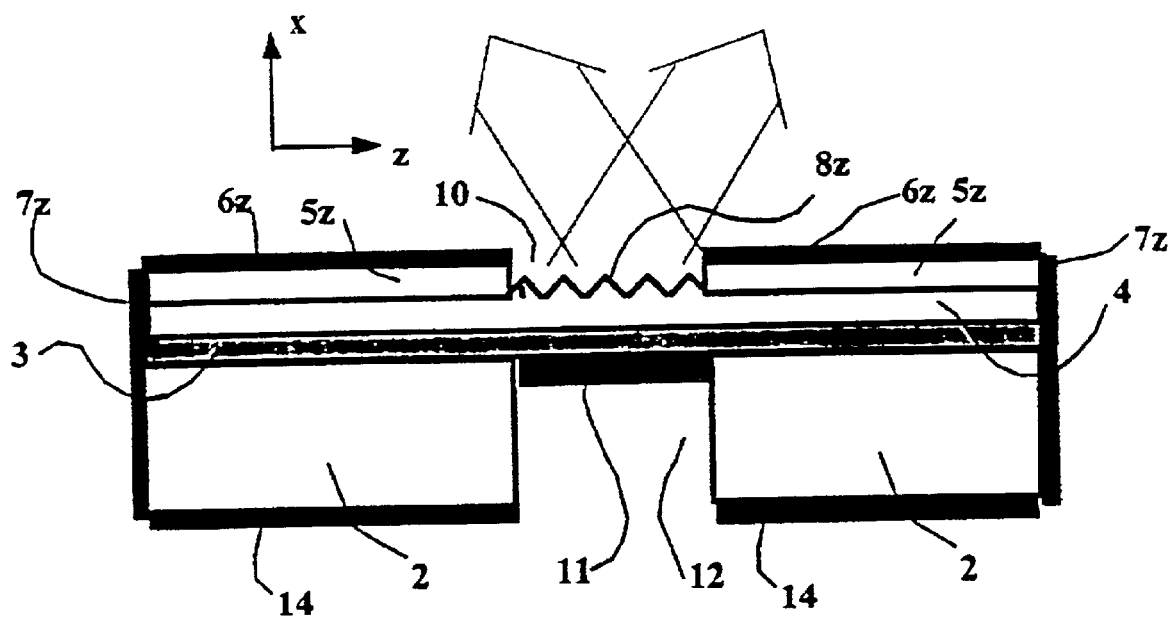
FIG. 6 shows a laser diode using cleaved facets and a reflective layer beneath part of the waveguide.

FIG. 6 shows a laser with two reflective end facets and an OC grating between the pumped regions. Beneath the OC grating is a reflector for reflecting the two downward directed beams back up toward the surface of the laser. Capturing the downward beams is useful to increase efficiency.

Figure 7A:
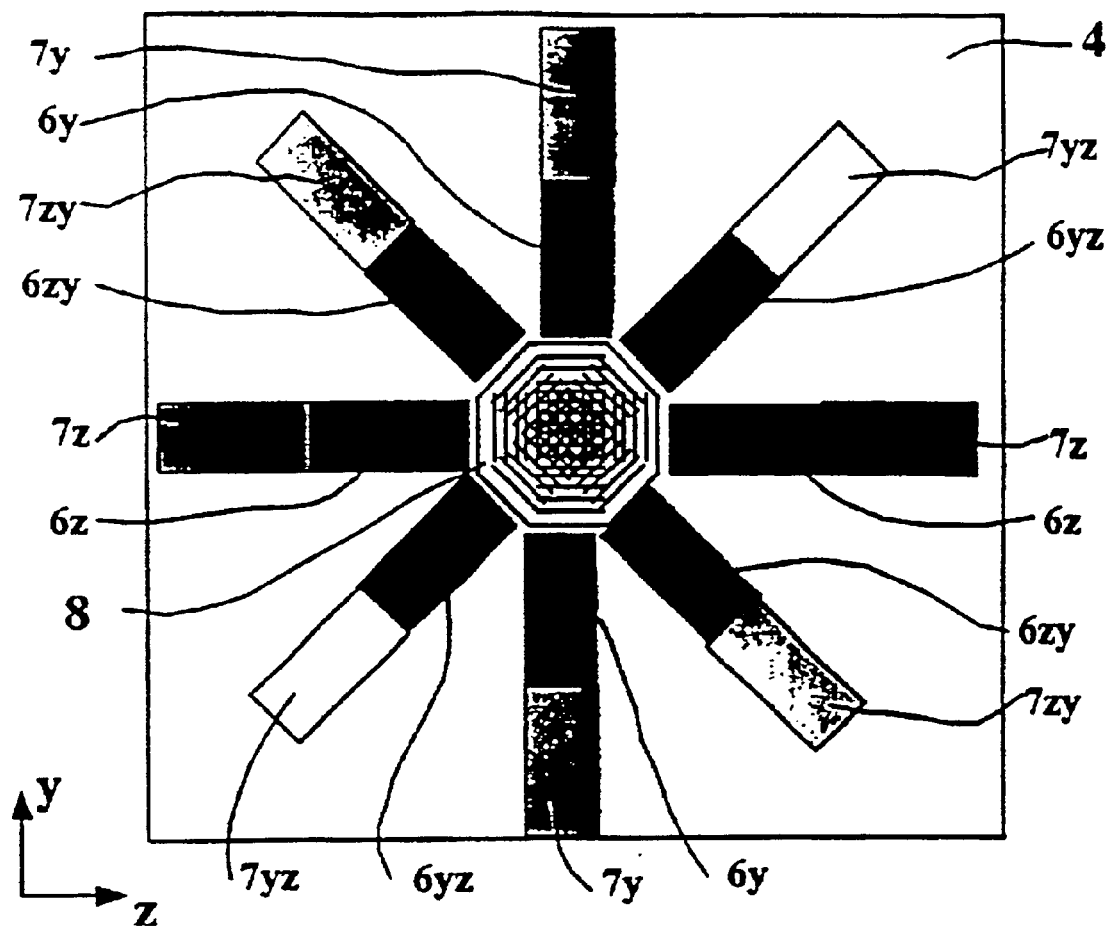
FIG. 7a shows a top view of four crossed DBR lasers each outcoupling light from the same outcoupling element.
Figure 7B:
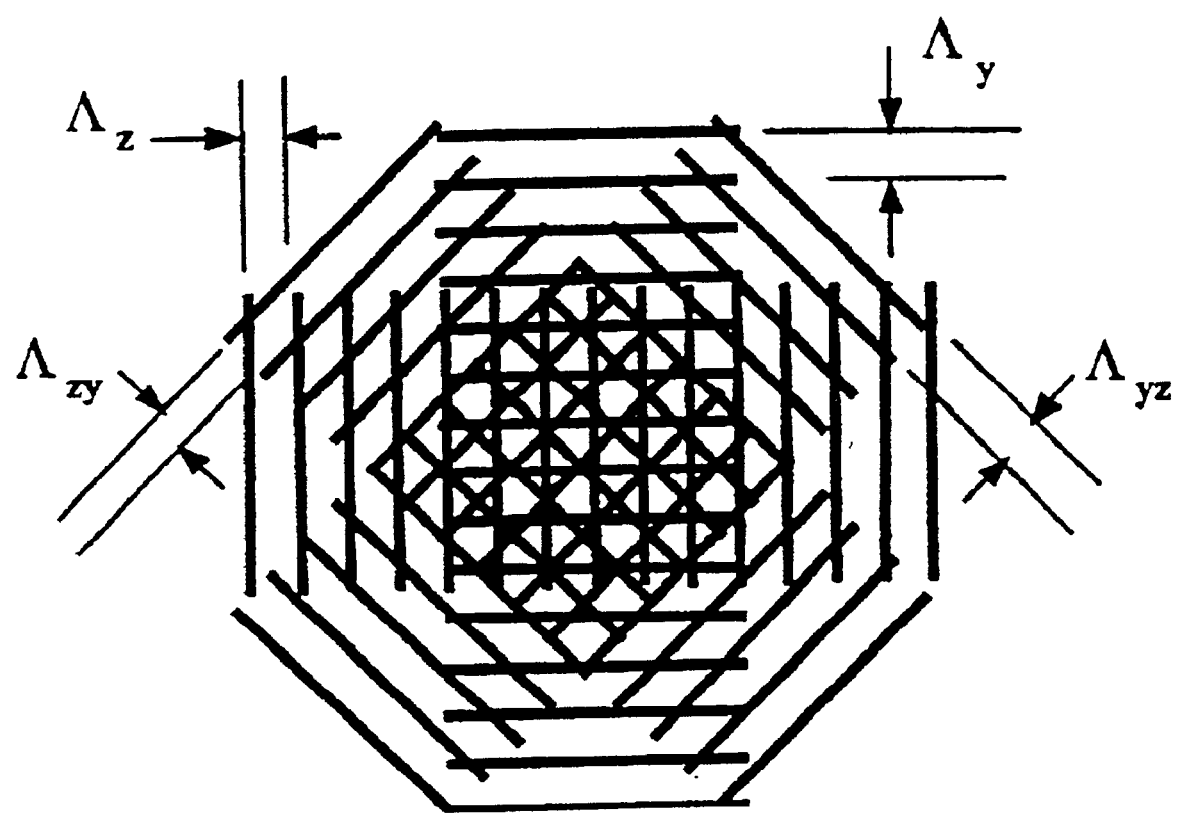

FIG. 7a shows a GO laser system with four crossed lasers being outcoupled at the same spatial location. Distributed Bragg reflectors are shown in this example at each end of the individual lasers. Each laser has its own OC grating superimposed on the other OC gratings to create one virtual grating. (Note that it is possible to overlap the gratings in different planes, having either curved waveguides or making each laser totally in a different plane than the others, but this is a less preferred embodiment. HOEs can be used in place of multiple gratings in such a situation.) FIG. 7b shows a close-up of the outcoupling gratings for the four laser system. There are four gratings, each at a 45 degree angle to the adjacent gratings. The periods of these gratings need not be the same, which allows the use of multiple wavelengths being outcoupled at the same location (assuming the lasers themselves are fashioned to output different wavelengths). The periods of the various gratings are labeled as Lz, Ly, Lzy, and Lyz.

The structure of the grating outcoupled laser allows for the high-level integration of electronic circuitry with the laser device. Many different possible devices can be integrated with the GO laser of the present application, including control electronics and photonic integrated circuits that can be placed on the chip with the laser; electronic integration includes higher level data management electronics such as serialization/deserialization, clock generation and recovery, op amps and analog-to-digital and digital-to-analog converters. The GO laser geometry is also advantageous in that it allows for integration with optical waveguides and integration of light routing circuitry on the chip. Such photonic integration allows optical interconnects between circuit elements, integration of optical isolators, wavelength tunable sections, optical modulators, waveguide couplers, waveguide switches, and simultaneous integration of multiple ones of these components.

Figure 8:
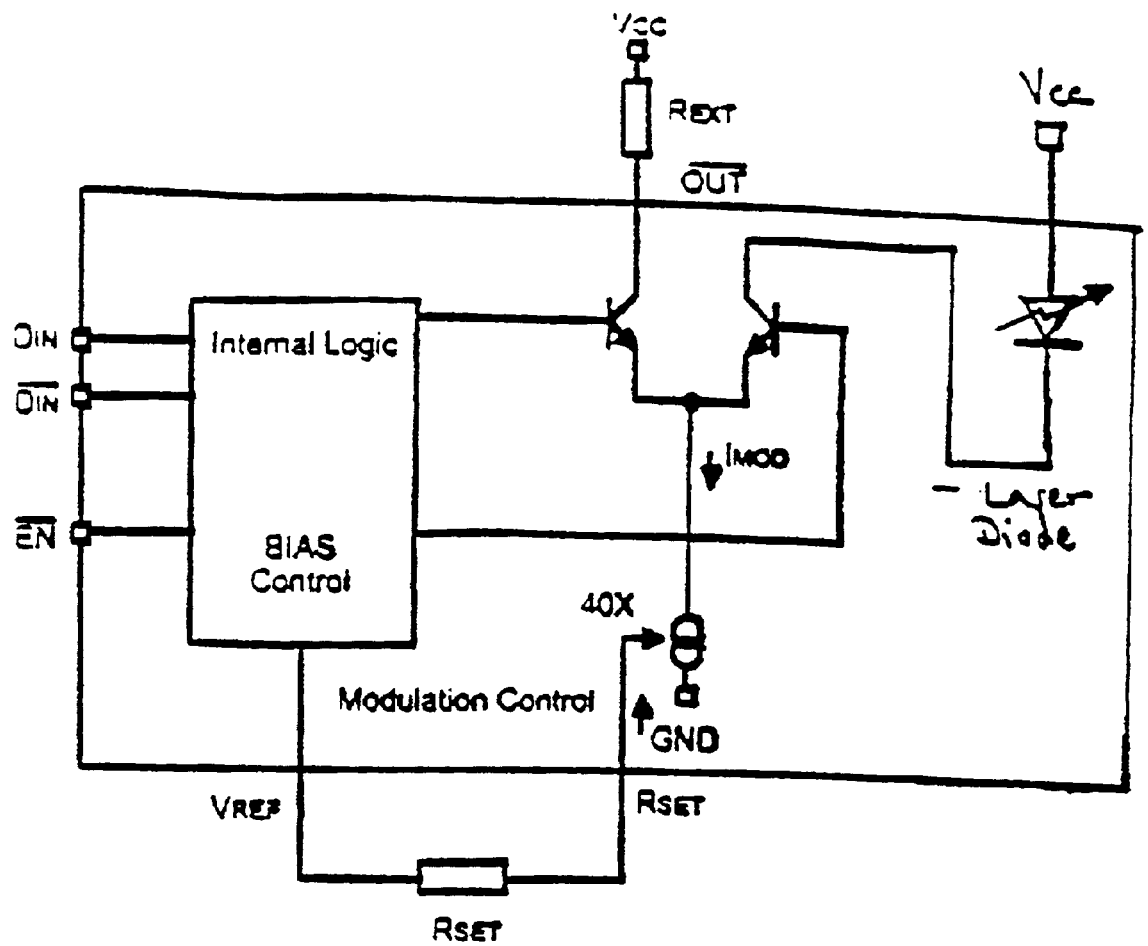
FIG. 8 shows a circuit diagram of integrated elements with the presently disclosed laser system.

FIG. 8 shows an example of a higher level circuit integration on the same chip as the grating outcoupled laser diode. In this example, laser driver and control electronics are integrated. Din and Din-bar are differential data inputs and EN is the chip enable. Internal logic and BIAS control is used to center the data to the inputs of the driver pair and to provide a Vref output. This output is used with Rset to control the current source or modulation current Imod which sets the output current to the grating outcoupled laser diode. The resistor Rext is external to minimize the power dissipation capacity, both Rext and Rset may be integrated as well.

Figure 9:
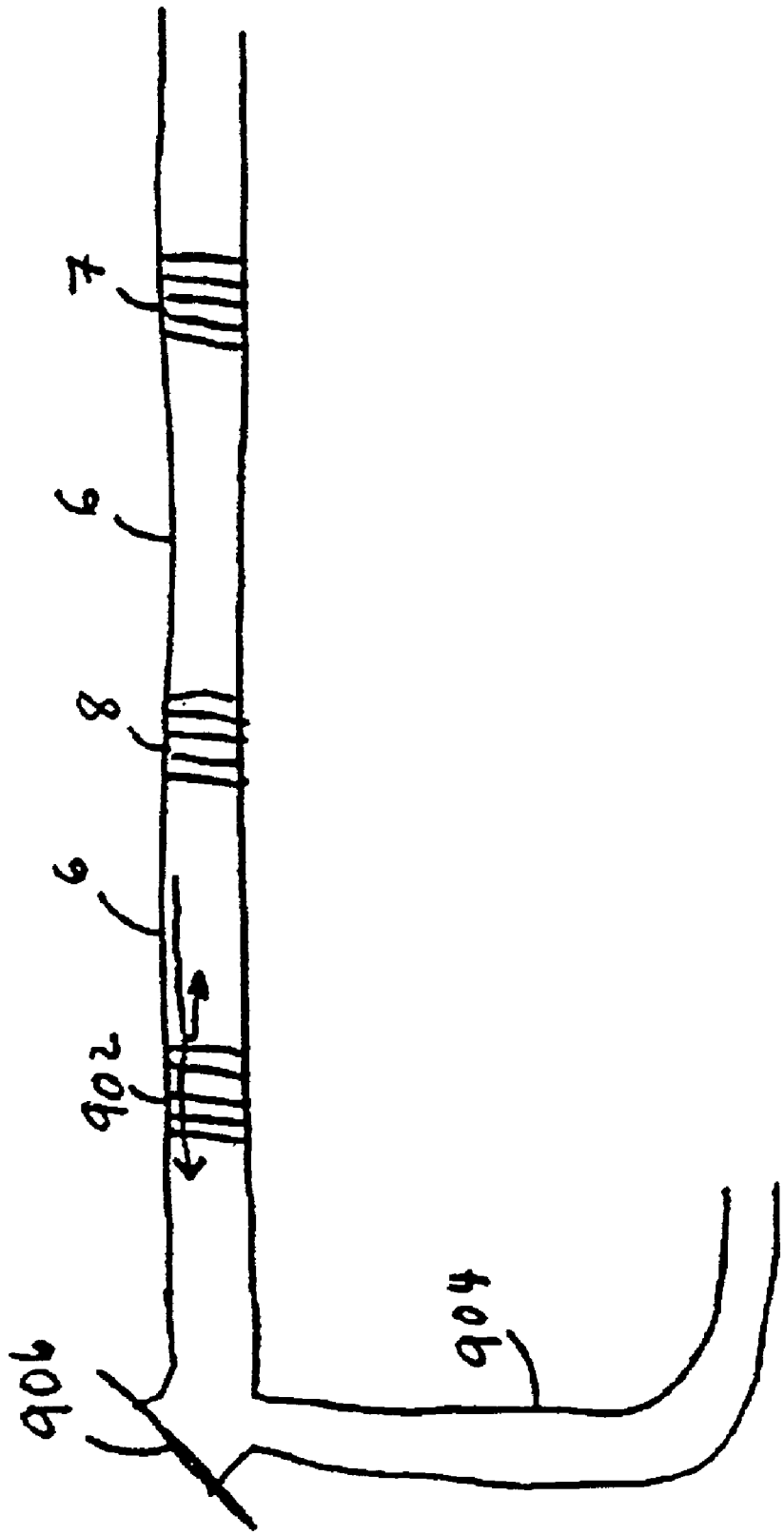
FIG. 9 shows optical waveguides routing light from the laser to other elements.

FIG. 9 shows the optical waveguide technology routing the light from the laser source to another integrated circuit component, for example. One end of the laser has a partially transmitting reflector 902 which allows some of the light to pass through. This light is guided by a waveguide 904 to another circuit element as desired for any given application. In the example shown, a corner turning mirror 906 is used to guide the light.

Figure 10:
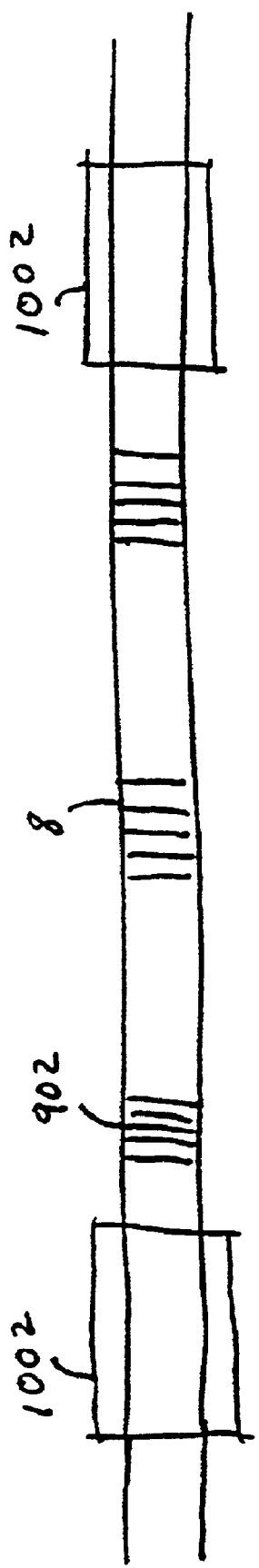
FIG. 10 shows a possible configuration for integrated elements with a laser diode.

Other devices can also be integrated on the same chip with the innovative laser system of the present application. FIG. 10 shows a grating outcoupled laser diode with the OCG 8 between the two reflectors 902 at either end of the cavity. One or both reflectors are partially transmitting gratings in this example. In this variation, a waveguide coupler, which may be used for connecting to other integrated devices, is located outside the laser cavity. A location for such an integrated device 1002 is shown at either end of the cavity. Of course, other devices could also be integrated, for example, modulators or tuning sections.

Figure 11:
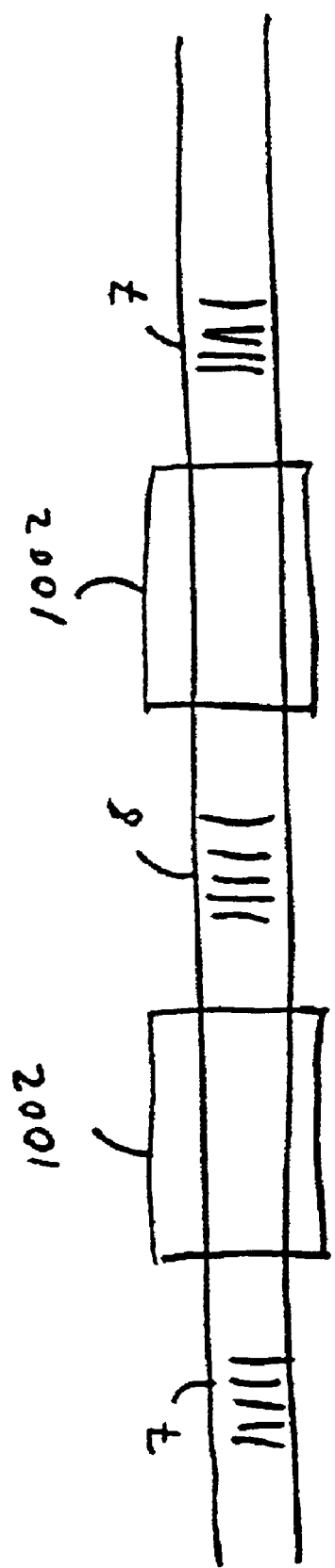
FIG. 11 shows another possible configuration for integrating added elements to the present innovations.

FIG. 11 shows another possible variation for integrating added components (such as a phase adjustor, for example). In this example, two regions 1002 where added devices may be fabricated on chip are shown. In this example, the added components are located within the length of the laser, possibly requiring the gain region contacts to be moved or altered to accommodate the added device.

Figure 12:
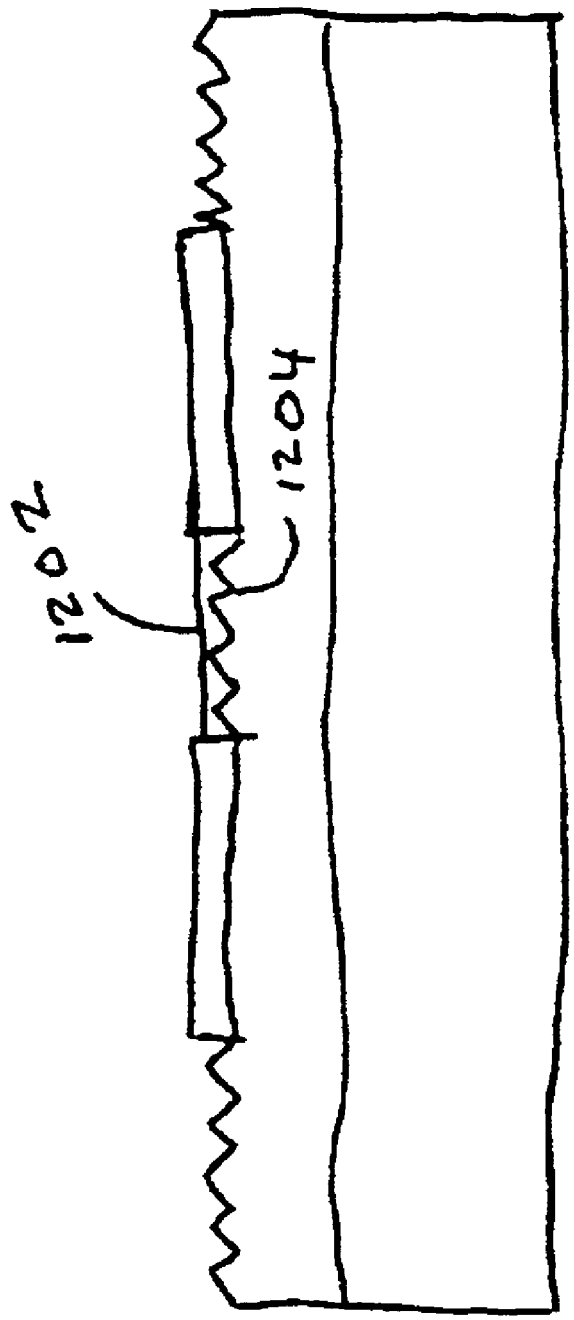
FIG. 12 shows another embodiment of the present application.

FIG. 12 shows another embodiment of the present innovations. In this variation, a reflective coating 1202 (for example, a dielectric stack or a metal layer) is placed on top of the device, where the outcoupling grating 1204 is located. This reflective coating causes the light to be coupled through the bottom of the device. (Note that it is often useful to allow some light to escape the top of the device in this design, as this light can be used to allow easier wafer level probe testing of the device.) If an outcoupling grating is used without such a reflective coating, there is of course light emitted both above and below the waveguide due to reflection from the grating. The reflective coating causes the top emitted lobe of light to instead be emitted through the bottom of the device, so that substantially all light emitted from the cavity is coupled out through the substrate material, which is a transparent material, usually about 100 microns thick. The reflective coating can be metallic (such as gold) or it can be a dielectric stack for better reflection. Generally, if the light is to be emitted out the bottom of the device, a high reflect (HR) coating is placed on top of the device to reflect the light downward. An anti-reflect (AR) coating may be added to the bottom of the device in this case. Alternatively, if the light is to be emitted out the top surface, the HR coating may be placed on the bottom of the device, and an AR coating placed on top.

Causing the light to be emitted through the bottom of the device has the advantage of allowing the heat sink to be placed on the top of the laser, closer to the locations where heat is generated, increasing efficiency of heat sinking. In such a case, the device is preferably mounted "upside down", with the reflective coating and DBRs beneath, the substrate on top, facing a fiber core for coupling, for example. This variation helps feedback in the cavity and can decrease threshold current by 50% or more.

In FIG. 12, the laser device is shown with an outcoupling aperture between the DBRs. An outcoupling grating is shown in this example. On top of this grating is located a reflective coating that directs outcoupled light down through the substrate.

Figure 13:
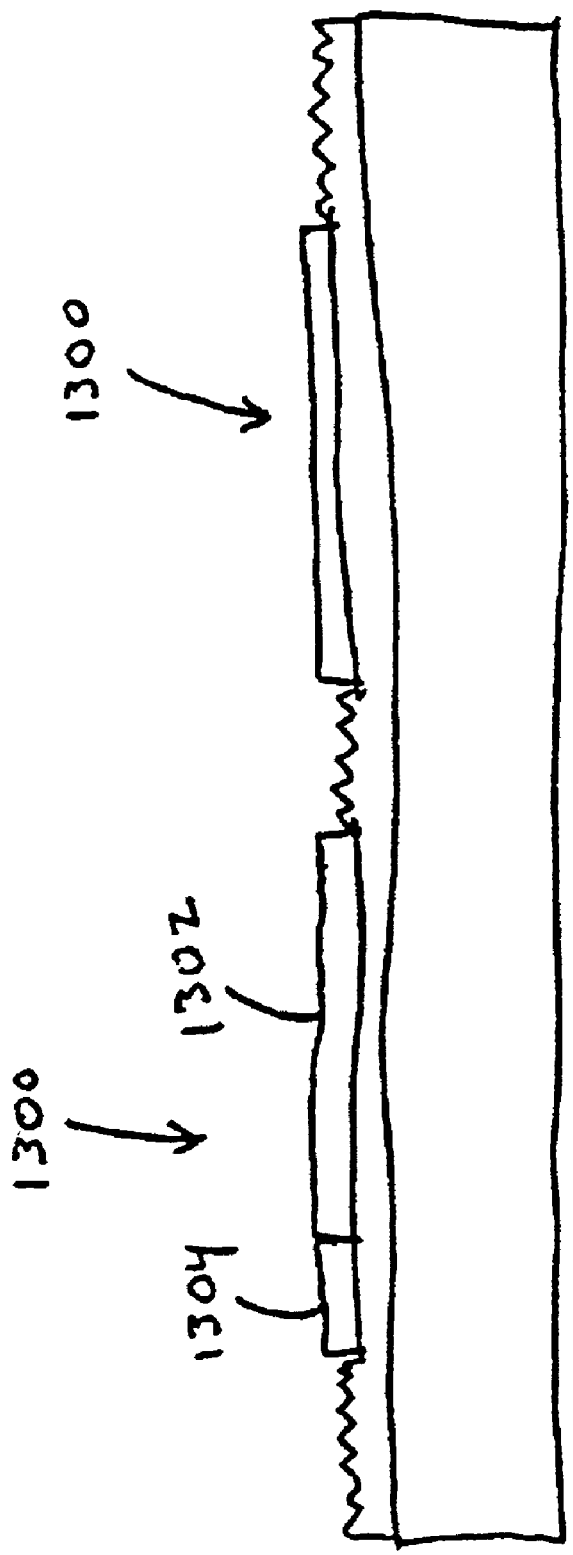
FIG. 13 shows another embodiment of the present application.

The gain region or regions of the present innovations can be modified to provide added functionality. FIG. 13 shows a DBR laser according to an embodiment of the present innovations. The gain region 1300 has multiple parts in this example, one on either side of an outcoupling grating. One part of the gain region is further split into two parts, a larger 1302 and a smaller 1304 section. The smaller part, which can be used to more sensitively adjust the current supplied to the gain region, is used for several purposes. It can be used as a fine tuning device for the wavelength of the light in the cavity. By increasing or decreasing the current, the wavelength can be slightly tuned to some degree. The smaller contact can also be used to modulate the signal generated in the cavity. By varying the supplied current over time, the intensity of the emitted light can be varied. This can be used to modulate the signal by adjusting the current over time to alter the intensity of light, and thus embed a signal in the emitted light. The smaller contact is the preferred one to use for such modulation, since it will allow faster modulation (due to lower capacitance, etc.).

Figure 14:
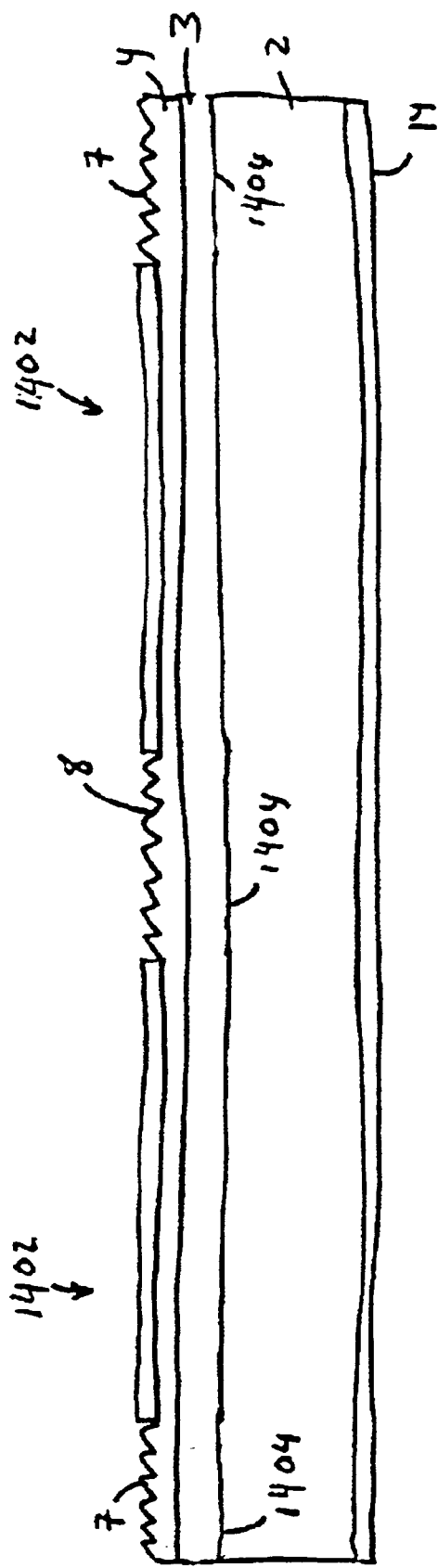
FIG. 14 shows a DBR laser with thinned quantum wells beneath the outcoupling grating and beneath the DBRs.

FIG. 14 shows a side view of a DBR laser according to another embodiment. The laser has a cavity and two reflector gratings 7, one at each end. Between the reflector gratings are the gain region 1402 and the outcoupling grating 8.

The waveguide 3 in the laser may be made from multiple layers including an active and guiding layer containing the junction between the p and n type semiconductor materials. For example, this region might comprise a sequence of one or more barrier layers alternating with quantum well layers.

In the embodiment shown in the figure, the quantum wells 1404 are made thinner beneath the reflector gratings 7 and beneath the outcoupling grating 8. This results in a less lossy, more transparent device. The larger bandgap in the thinner quantum well regions (i.e., in the unpumped regions) means less absorption of photons in the cavity because higher photon transition energy is required. This lowers internal loss, increases efficiency, and lowers the required threshold current for the device.

The quantum well thickness, by controlling the required transition energy, affects the wavelength of the photons that will lase in the cavity. This allows large scale tunability of the device during fabrication by controlling quantum well formation.

Quantum wells are fabricated at different thicknesses using selective growth of epitaxial layers. This selective growth phase of processing can also be used to simultaneously improve the performance of integrated components such as electro-absorption modulators, which benefit from quantum well structures that can be made more transparent (or have a higher photon transition energy). The integrated devices are fabricated at the same time and during the same set of processes as the lasers themselves, and selective growth can be used on them without significant process cost added.

Figure 15:
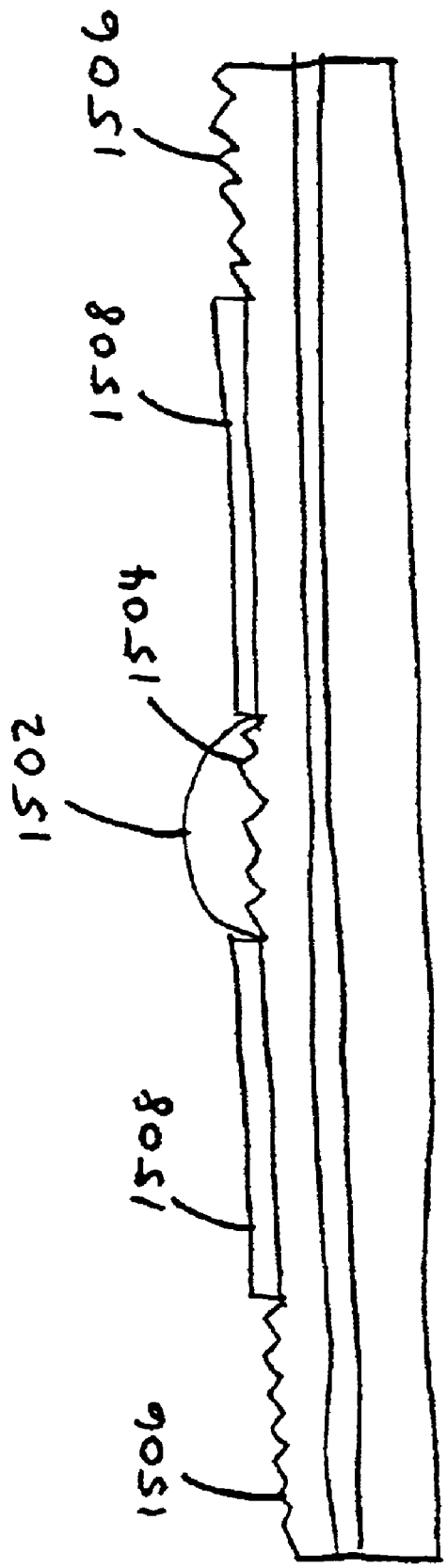
FIG. 15 shows another embodiment of the present application.

FIG. 15 shows another embodiment. In this variation, a fractional-spherical lens 1502 made of an optical polymer is formed on the outcoupling grating 1504 (by a microjet process, for example). This lens acts to make different wavelengths of light (which may exit the OCG at different angles than the normal, or from one another) converge to be coupled into a fiber mode, for example. Since the index of refraction of the material outside the lens is lower than the index of refraction of the lens, light rays passing through the lens to the lower index material will be refracted away from the normal to the surface of the lens at that point. Depending on the index difference, the refraction can be great or small. This element can be used to allow design margin in the size of the outcoupling grating. With the added lens, the outcoupling grating can be made larger, (50 microns, for example), which is useful in high power applications. Normally, an outcoupling grating of 10 micron size can outcouple light in the hundreds of milliwatt range or higher, but with larger outcoupling gratings light of higher power, well above a watt, can be outcoupled and confined to a fiber mode.

Other types of intermediate lens devices (gratings, HOEs, etc.) can also be used at this location to aid in coupling light from the outcoupling grating into a fiber core (for example). Such devices can be made on chip, or be separate devices added after processing is complete.

FIG. 15 shows a sample embodiment of the device. This embodiment comprises a DBR laser as described previously in this application, with outcoupling grating 1504 located between the two reflector gratings 1506. Gain regions 1508 are on either side of the OCG. A lens 1502 which is partly spherical in shape is formed on the outcoupling grating.

Figure 16:
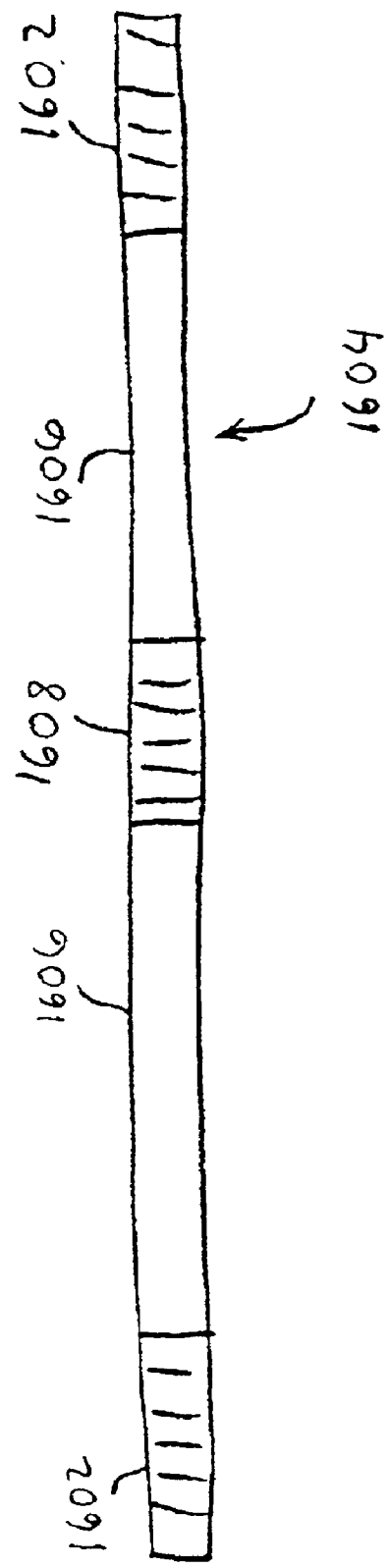
FIG. 16 shows a laser diode for implementation in a preferred embodiment.

FIG. 16 shows a top view of a surface emitting laser diode (LD). The LD comprises reflectors, preferably distributed Bragg reflectors (DBRs) 1602, at either end of a waveguide 1604. Contacts 1606 are positioned between the DBRs for electrically pumping the active or gain region. An outcoupling element 1608 is positioned within the envelope of the pumped region in this example. Note that the outcoupling element could also be at one end of the pumped region, between the two reflectors 1602. In the preferred embodiment, the outcoupling element is a Bragg grating or a holographic optical element (HOE). The active region is excited by current applied to the electrodes, causing stimulated emission of photons in the waveguide. This light is reflected within the cavity by the two DBRs positioned at either end. The period of these DBRs determines which wavelengths will satisfy the Bragg condition, and therefore which wavelengths will resonate within the cavity. This light is coupled out of the waveguide at an angle to the surface of the waveguide by the outcoupling grating (OCG). The outcoupled light will be emitted normal to the surface if the OCG has a period equal to an integer number of wavelengths of the light resonating in the cavity. If the period is not such an integer number of wavelengths, then the light is emitted at an angle to the normal. This device is referred to in the present application as a grating outcoupled (GO) laser, and forms the central waveguide referred to below. (The waveguides disclosed herein can be ridge guides, buried heterostructures, or any other waveguide technology.)

Figure 17:
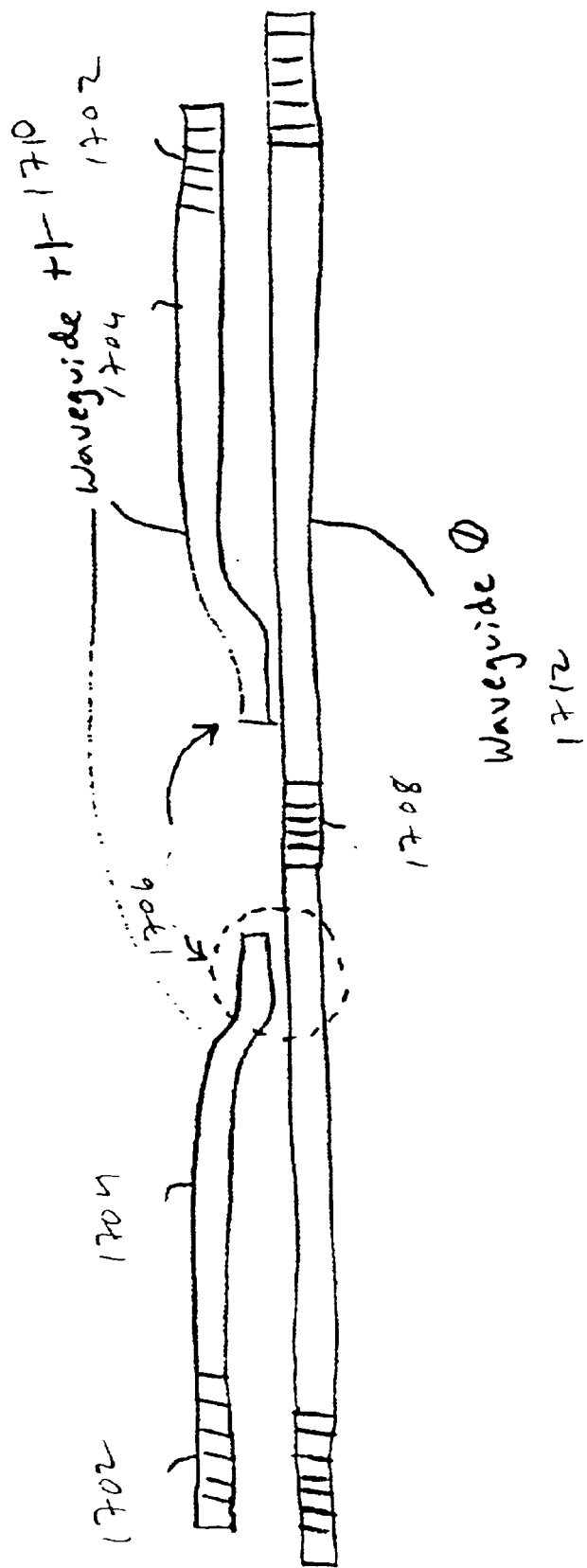
FIG. 17 shows two laser cavities coupled together to output light through a common outcoupling aperture, according to a preferred embodiment.

FIG. 17 shows a GO laser with laterally coupled waveguides. The structure comprises a GO laser as in FIG. 16 with waveguides 1710 (referred to as waveguides +1) attached to the central waveguide 1712 (referred to as waveguide 0) as shown. The added waveguides 1710 are attached to both sides of the central waveguide 1712, forming a preferably symmetric structure. Each added waveguide 1710 has a reflector, preferably a DBR 1702, at the end to reflect light of a particular wavelength in the cavity. The added waveguides 1710 include contacts 1704 to electrically stimulate the active regions therein, causing electron hole recombination which gives off photons.

All the waveguides in the preferred embodiment have electrically pumped regions along much of the length of the waveguide structure. The pumped region can be limited to certain regions of the waveguide, but this would decrease power output. As shown in FIG. 17, the waveguide +1 1710 couples to waveguide 0 1712 very near the outcoupling grating 1708. This coupling can occur anywhere along waveguide 0 1712 between the DBR of waveguide 0 1712 and the OCG 1708. In an alternative embodiment, the added waveguides are passive, having no pumped regions.

The electrical contacts used to pump the gain region have a tendency to alter the index of refraction in the waveguide due to gain induced index suppression. This provides another advantage to the present innovations in that the contact located near the coupling regions 206 can be separate from the main contact 204. This allows the main contact to be pumped to obtain maximum power output, while allowing the contact in the coupling region to be pumped so as to maximize coupling efficiency between the two waveguides.

For the structure shown in FIG. 17, the added waveguides 1710 effectively add one resonating cavity to the laser diode system. Thus, light of central wavelength L0 resonates within the central cavity (formed by waveguide 0) because the DBRs at either end of the central cavity (i.e., waveguide 0) have periods chosen to satisfy the Bragg condition for wavelength L0. The DBRs at the ends of the second cavity (formed by waveguide +1) are chosen to satisfy the Bragg condition for wavelength L1. Thus, light with central wavelength L1 resonates within this cavity. Photons of wavelengths L1 satisfy the Bragg condition and are reflected by the DBRs of waveguide +1. This sets up a standing wave for this wavelength in this cavity. The cavity for wavelength L1 comprises both added waveguides +1 on either side of the OCG, as well as the part of waveguide 0 near and between the coupling region. Light resonating in waveguide +1 reflects off one DBR, couples to waveguide 0, goes past the OCG (at which light is output), then couples back into the other half of waveguide +1, reflects of that side's DBR, and repeats the process.

The light from this added waveguide 1710 and from the central waveguide 1712 is output by the OCG 1708 at the center of the gain region in this figure. The period of the OCG determines the outcoupling angle of the light. If the period is an integer number of wavelengths of the output light, the light is output normal to the surface. This is referred to as resonant outcoupling. Since each of the two cavities resonates with light of a different wavelength, the light from each cavity will be output at different angles. In a preferred embodiment, the OCG has a period that outcouples light from the central cavity normal to the surface, and outcouples light from the secondary cavity at an angle to the normal in what is called off-resonant outcoupling.

Figure 18:
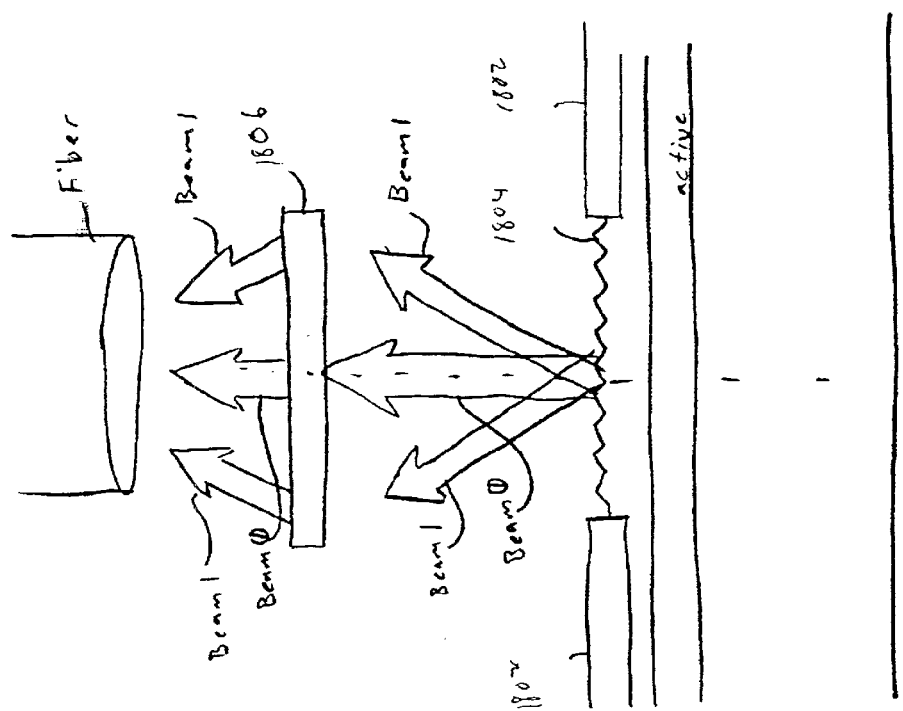
FIG. 18 shows a detail view of the outcoupling aperture of the innovative laser diode system.

In a further innovation, an added optical element combines the various outcoupled beams so they may be coupled to (for example) a fiber core. Such a system is shown in FIG. 18, which shows a close up view of the OCG 1804, seen from a side view. This figure shows the contacts 1802 for the gain regions on either side of the OCG 1804. The different wavelength beams (i.e., beam 0 and beam 1) emerge from OCG 1804 at different angles. Beam 0 emerges at the normal to the surface (indicating resonant outcoupling for that wavelength), while beam 1 emerges at an angle (indicating off-resonance outcoupling). Note there are two lobes to beams 0 and 1 because of the forward and rearward propagating waves in the cavities. The two lobes of beam 0 are atop one another because the exit angle is the normal.

These different beams are preferably captured by another optical element 1806 which is positioned and fashioned to combine these spatially different beams into the same spatial region. In a preferred embodiment, the outcoupling grating 1804 and the added optical element 1806 are fabricated directly on the chip as a holographic optical element. Note that in the figure the OCG 1804 and the added optical element 1806 are shown separate, but they may be placed contiguous with one another or even be fashioned into the same element. Another alternative way to couple the light into a waveguide (such as a fiber) is to integrate a lens over the grating to collimate or focus beams of light into, for example, a fiber core. Such a lens is shown in FIG. 15 as part of the outcoupling grating in a laser diode.

Figure 19A:
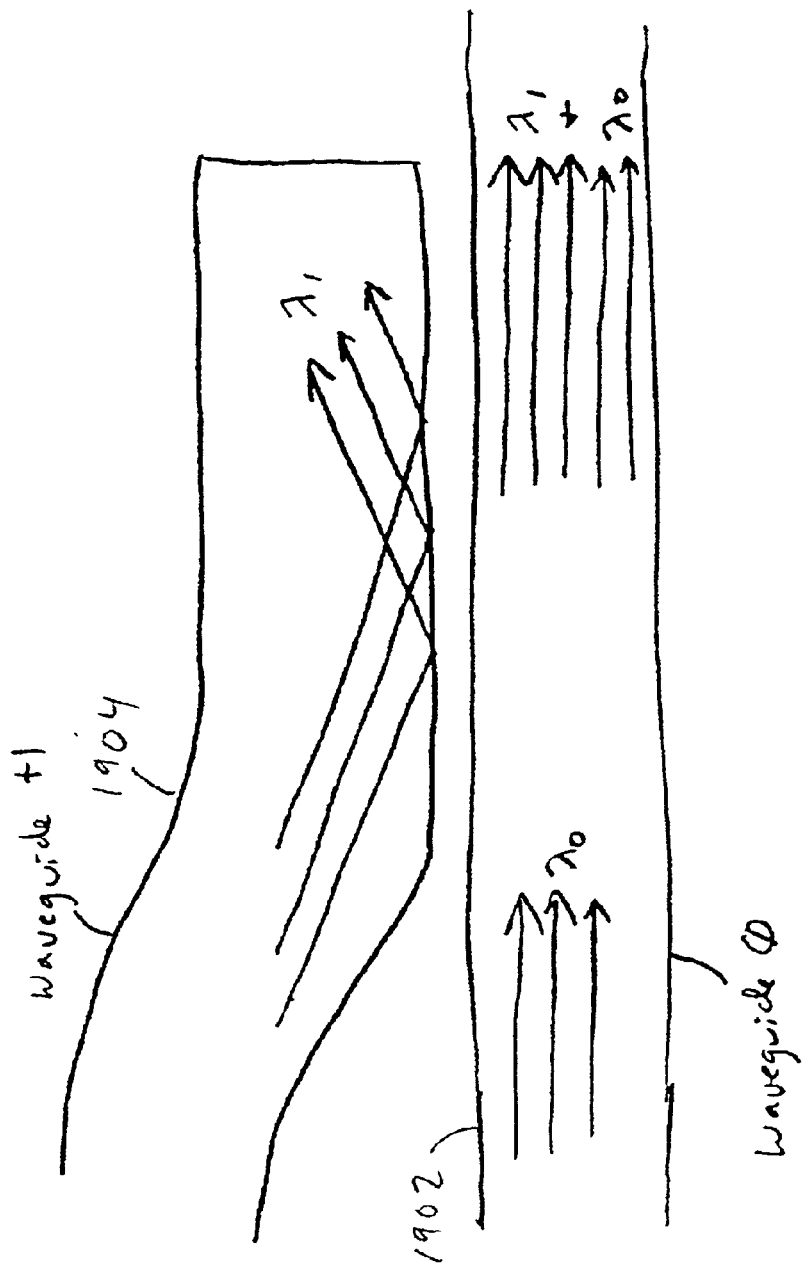
FIG. 19A shows a detail of the coupling region.
Figure 19B:
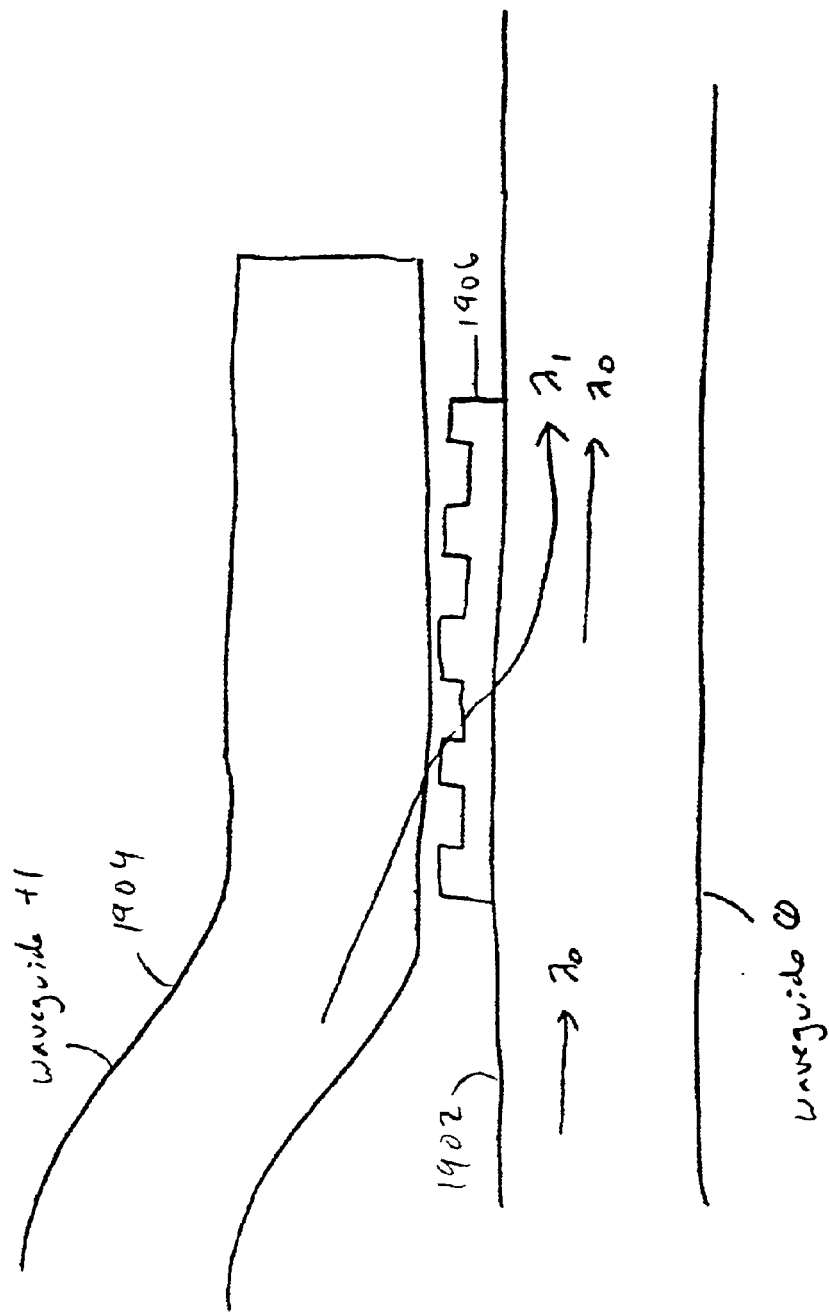
FIG. 19B shows a detail of the coupling region with grating enhanced coupling.

FIGS. 19A and 19B shows details of the coupling region between the two waveguides 1902, 1904. In one embodiment (FIG. 19A) the two waveguides 1902, 1904 are coupled only by evanescent coupling. Wavelength L1 couples from waveguide +1 1904 into waveguide 0 1902. This results in both wavelengths L0 and L1 in waveguide 0 1902.

In another embodiment, the added waveguides 1904 are coupled to the central waveguide 1902 through grating 1906 assisted directional coupling. Such a system is shown in FIG. 19B. The two waveguides are brought close together near the coupling point, allowing grating assisted coupling to occur. Since the two waveguides may be made from material with similar or identical indices of refraction, the evanescent coupling efficiency can be quite high and can suffice without the assistance of a grating. However, the use of a grating 1906 can make coupling even more efficient, or allow different index materials or different waveguide dimensions to be used for the two waveguides if necessary.

Grating assisted coupling can also shorten the necessary interface between the two waveguides. Where a typical coupling relying solely on evanescent coupling might need hundreds to thousands of micrometers to obtain good coupling, use of a grating to assist coupling can reduce this distance greatly. In a preferred embodiment, the two waveguides 1902, 1904 are brought together, preferably at a distance of between 4–10 micrometers center to center. The exact figure of course depends on the dimensions and requirements of the laser diode system itself. A grating 1906 is positioned between the two waveguides to facilitate coupling. The grating is preferably fabricated as part of the semiconductor fabrication process.

The region where coupling occurs has, in a preferred embodiment, an electrical contact positioned to vary the optical properties of the waveguide to which it is connected. This contact can be either on the central waveguide, the lateral waveguide, or both. By varying the optical properties of either or both waveguides in this region, the amount of coupling between the waveguides is controlled. This coupling-controlling contact is preferably separate from the contacts used to pump the gain regions of the waveguides.

Either contact can be used to modulate the light from the various waveguides. For example, in the case of a central cavity and a lateral cavity comprising two separate waveguides (as shown in FIG. 17), the voltage applied to the contact in the gain region 1704 can be varied so as to vary the intensity of light generated in the lateral cavity. This intensity variation can be used to modulate the light out of the second cavity independently of modulation of the light from the first cavity. Likewise, the contact to the lateral waveguide which is located in the coupling region 1706 can also be used to modulate the light signal from the second cavity. This is done by varying the coupling percentage from the second cavity into the central cavity, and hence varying the intensity of the light from the second cavity output through the outcoupling aperture. Alternatively, both electrical contacts can be used at once to modulate the signal.

Figure 20:
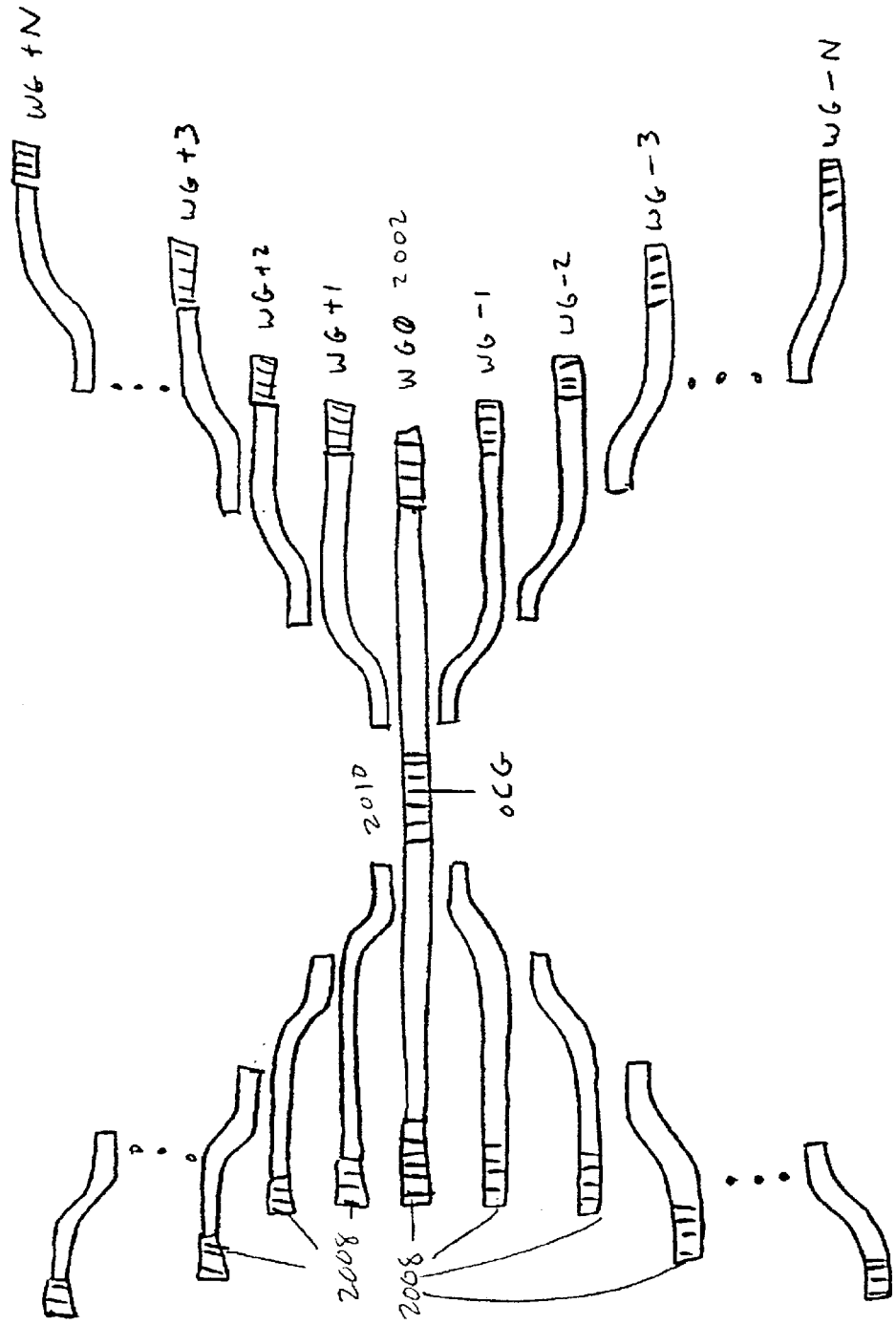
FIG. 20 shows how a multiplicity of cavities can be implemented as a preferred embodiment.

FIG. 20 shows an extended version of the system, with multiple added waveguides attached to couple light ultimately into the central waveguide 0 2002, so that the light from the multiple waveguides can be coupled out of the device by a single OCG 2010. In this example system, N waveguides are added to each side of the central waveguide 0 2002, with one side being numbered positive (waveguides +1, +2, +3, . . . +N) and the other side being numbered negative (waveguides −1, −2, −3, . . . −N). Each waveguide preferably has different DBRs 2008 at the ends, so that each waveguide resonates with a different wavelength. Such a system is capable therefore of generating 2N+1 distinct wavelength signals and coupling those signals from a single OCG 2010. The exact configuration shown in FIG. 20 is an example, and other configurations are of course possible. For instance, the waveguides might be arranged differently to conserve area, by facing them in alternating directions as more waveguides are added.

Figure 21:
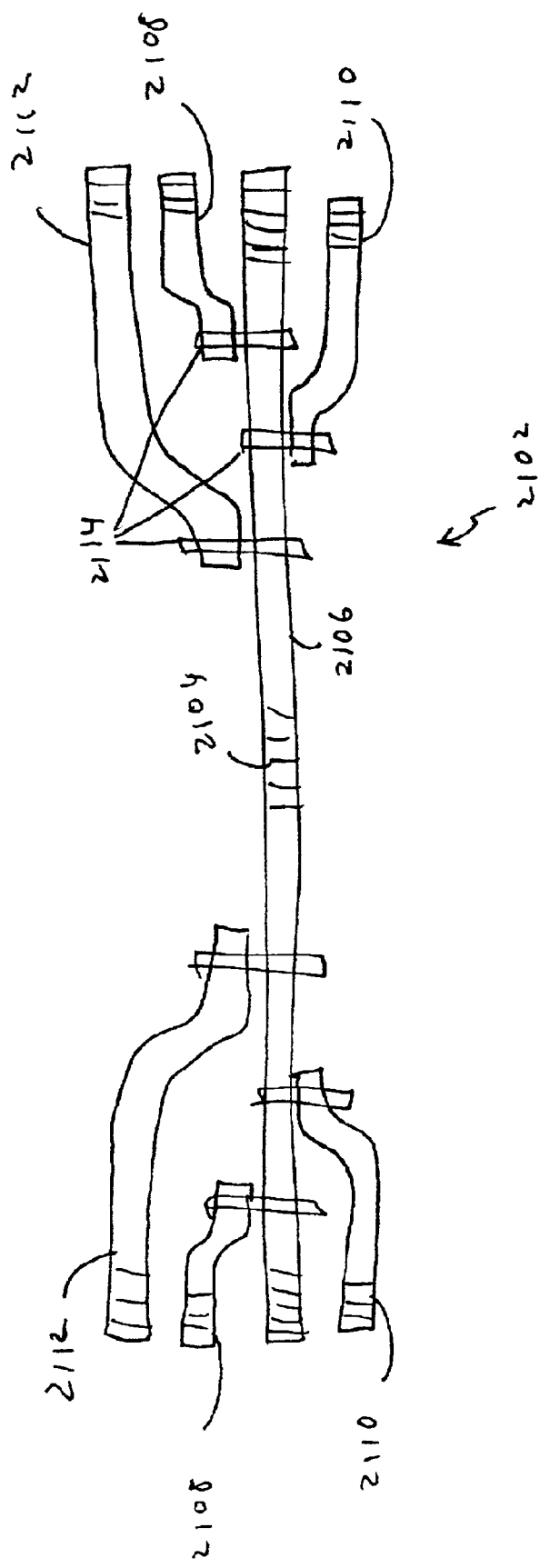
FIG. 21 shows an alternate configuration of multiple waveguides and cavities according to a preferred embodiment.

FIG. 21 shows another possible configuration of cascaded or nested waveguides to form a plurality of cavities in the laser diode system. In this example, a laser diode 2102 has an outcoupling aperture 2104 positioned to emit light from various laser cavities. the central cavity 2106 is positioned with other waveguides 2108, 2110, 2112 fabricated nearby, with part of the other waveguides 2108, 2110, 2112 positioned very near to the central waveguide 2106. Switches, preferably comprising electrical contacts which can vary the optical properties of selected waveguides, are also shown at the coupling regions for each waveguide. This configuration has the advantage of not requiring light of different wavelengths to pass through a multiplicity of coupling regions, each of which may be designed for coupling only a particular wavelength of light.

It should also be noted that the various laser diodes can be operated at different wavelengths, or selected ones can be formed to operate at the same wavelength, providing redundancy and therefore robustness to the integrated laser diode system.

The innovative system disclosed herein has at least two broad applications. First, the system can be operated with some or all cavities being pumped at once, generating and outcoupling up to 2N+1 wavelengths simultaneously. Each waveguide can be modulated separately (for example, using dc modulation of the pump electrodes, or dc modulation of the coupling electrodes) to generate 2N+1 uniquely modulated signals, each of a different central wavelength. (Of course, all waveguides need not generate different wavelengths—some could generate redundant wavelengths if desired.)

A second possible broad application includes using the innovative system as a tunable laser source. By pumping only one waveguide gain region at a time, a single wavelength is generated and outcoupled. (For example, if a source generating wavelength +L5 is needed, then waveguide +5 would alone be pumped.) By only pumping the waveguide with the resonant wavelength desired, any of the multiple resonant wavelengths can be generated. Creating the DBRs of the various waveguides to reflect wavelengths that are closely placed allows a wide range of tunable frequencies to be generated.

These applications are only examples, and are not intended to limit the possible scope of the presently disclosed innovations.

Definitions

Following are short definitions of the usual meanings of some of the technical terms which are used in the present application. (However, those of ordinary skill will recognize whether the context requires a different meaning.) Additional definitions can be found in the standard technical dictionaries and journals.

Chirped Grating: a grating whose period varies over its area;

DBR: Distributed Bragg Reflector;
DFB: Distributed Feedback (Laser);
DWDM: Dense Wavelength Division Multiplexing;
GO: Grating Outcoupled (Laser);
HOE: Holographic Optical Element;
LED: Light Emitting Diode;
LD: Laser Diode
Modulate: any controlled variation of the signal, including intensity or frequency or phase;
OCG:Outcoupling Grating;
VCSEL: Vertical Cavity Surface Emitting Laser;
Waveguide: a structure which guides the propagation of photons, usually by internal reflection.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An integrated laser diode system, comprising:
a first waveguide having a first reflector at a first end of the first waveguide and a second reflector at a second end of the first waveguide and an outcoupling aperture positioned to outcouple light at a location between the first reflector and second reflector of the first waveguide;
a second waveguide having a reflector at a first end of the second waveguide, wherein a second end of the second waveguide is optically coupled to the first waveguide;
a third waveguide having a reflector at a first end of the third waveguide, wherein a second end of the third waveguide is optically coupled to the first waveguide;
wherein photons generated in the second and third waveguides are coupled into the first waveguide and emitted through the outcoupling aperture.

2. The integrated laser diode system of claim 1, wherein the second waveguide has a first electrical contact positioned to apply a voltage across a first region of the second waveguide, and wherein the second waveguide has a second electrical contact positioned to apply a voltage to the second end of the second waveguide.

3. The integrated laser diode system of claim 2, wherein the third waveguide has a first electrical contact positioned to apply a voltage across a first region of the third waveguide, and wherein the third waveguide has a second electrical contact positioned to apply a voltage to the second end of the third waveguide.

4. The integrated laser diode system of claim 1, wherein photons are generated in the second waveguide by applying a first voltage to a gain region of the second waveguide, and wherein the degree of coupling of the second waveguide to the first waveguide is controlled by applying a second voltage to the second end of the second waveguide.

5. The integrated laser diode system of claim 1, wherein the second end of the second waveguide and the second end of the second waveguide are optically coupled to the first waveguide by evanescent coupling.

6. The integrated laser diode system of claim 1, wherein the first reflector of the first waveguide and the second reflector of the first waveguide are distributed Bragg reflectors.

7. The integrated laser diode system of claim 1, wherein a grating is positioned between the first waveguide and the second waveguide to facilitate coupling of light from the second waveguide into the first waveguide.

8. A laser diode system, comprising:
a first cavity comprising a first waveguide having a first reflector at a first end of the first waveguide and a second reflector at a second end of the first waveguide, the first cavity having a fist section with an outcoupling aperture;
a second cavity comprising a second waveguide and a third waveguide and the first section of the first cavity, the second waveguide having a third reflector at a first end of the second waveguide, and the third waveguide having a fourth reflector at a first end of the third waveguide; and
wherein the second waveguide is optically connected to the first cavity at a first end of the first section of the first cavity, and wherein the third waveguide is optically connected to the first cavity at a second end of the first section of the first cavity.

9. The laser diode system of claim 8, wherein light emitted from the first cavity is modulated by varying a voltage applied to a section of the first cavity.

10. The laser diode system of claim 8, wherein the outcoupling region includes an outcoupling grating; and
wherein the outcoupling grating has a period which is an integer multiple of the wavelength of light generated in the first cavity, but not an integer multiple of the light generated in the second cavity.

11. The laser diode system of claim 8, wherein the second and third waveguides are optically connected to the first cavity through evanescent coupling.

12. A laser diode system, comprising:
a first cavity comprising a first waveguide;
a second cavity, the second cavity comprising a second waveguide and a third waveguide and a first section of the first waveguide;
wherein the second waveguide is coupled to the first waveguide through evanescent coupling at a first end of the first section of the first waveguide, and the third waveguide is coupled to the first waveguide through evanescent coupling at a second end of the first section of the first waveguide;
wherein photons generated in the first cavity are outcoupled through an outcoupling aperture, the outcoupling aperture being positioned in the first section of the first waveguide; and
wherein photons generated in the second cavity are outcoupled through the outcoupling aperture.

13. The laser diode system of claim 12, wherein the photons generated in the first cavity are of different wavelength than the photons generated in the second cavity.

14. The laser diode system of claim 12, wherein the second waveguide has a first contact electrically connected thereto to inject current into a gain region of the second waveguide, and a second contact electrically connected thereto to vary optical properties of the second waveguide.

15. A laser diode system, comprising:
a first cavity optically coupled to a second cavity by evanescent coupling at a coupling region;
wherein the first cavity has a first electrical contact and a second electrical contact; and
wherein the first electrical contact is used to generate photons in an active region of the first cavity, and the second contact is used to vary the optical properties in the coupling region of the first cavity.

16. The laser diode system of claim 15, wherein the coupling of the first cavity to the second cavity is assisted by a grating.

17. A laser diode system, comprising:
a cavity made from a first waveguide, a second waveguide, and a third waveguide, the first and second waveguides coupled to the third waveguide through evanescent coupling;
wherein the laser diode system outputs at least two different wavelengths of light through a single outcoupling aperture.

18. The laser diode system of claim 17, wherein the outcoupling grating is located on the third waveguide.

19. The laser diode system of claim 17, wherein the coupling of the first waveguide and the coupling of the second waveguide to the third waveguide are grating assisted couplings.

20. The laser diode system of claim 17, wherein the outcoupling aperture comprises an outcoupling grating and a coupling lens which alters the path of at least some of the outcoupled photons.

* * * * *